(12) United States Patent
Lee et al.

(10) Patent No.: US 11,587,837 B2
(45) Date of Patent: Feb. 21, 2023

(54) OXYGEN VACANCY PASSIVATION IN HIGH-K DIELECTRICS FOR VERTICAL TRANSPORT FIELD EFFECT TRANSISTOR

(71) Applicant: International Business Machines Corporation, Armonk, NY (US)

(72) Inventors: Choonghyun Lee, Kanagawa (JP); Takashi Ando, Eastchester, NY (US); Alexander Reznicek, Troy, NY (US); Jingyun Zhang, Albany, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 17/570,442

(22) Filed: Jan. 7, 2022

(65) Prior Publication Data
US 2022/0130732 A1  Apr. 28, 2022

Related U.S. Application Data

(62) Division of application No. 16/784,365, filed on Feb. 7, 2020, now Pat. No. 11,251,094.

(51) Int. Cl.
*H01L 21/8238* (2006.01)
*H01L 27/092* (2006.01)

(52) U.S. Cl.
CPC ......... *H01L 21/823857* (2013.01); *H01L 21/823864* (2013.01); *H01L 21/823885* (2013.01); *H01L 27/092* (2013.01)

(58) Field of Classification Search
CPC ..... H01L 21/823864; H01L 21/823857; H01L 27/0924; H01L 27/092; H01L 27/0922; H01L 21/8238; H01L 21/823821; H01L 29/6656
See application file for complete search history.

(56) References Cited

U.S. PATENT DOCUMENTS

| | | | |
|---|---|---|---|
| 9,954,103 | B1 | 4/2018 | Gluschenkov et al. |
| 10,008,584 | B2 | 6/2018 | Okaji |
| 10,170,590 | B2 | 1/2019 | Cheng et al. |
| 2016/0079385 | A1 | 3/2016 | Ellinger et al. |
| 2018/0114860 | A1 | 4/2018 | Gluschenkov et al. |
| 2018/0226489 | A1 | 8/2018 | Bi et al. |
| 2021/0249315 | A1 | 8/2021 | Lee et al. |

OTHER PUBLICATIONS

List of IBM Patents or Patent Applications Treated as Related; Date Filed: Jan. 7, 2022, 2 pages.

*Primary Examiner* — John A Bodnar
(74) *Attorney, Agent, or Firm* — Cantor Colburn LLP; Jeffrey S. LaBaw

(57) ABSTRACT

Embodiments of the present invention are directed to fabrication method and resulting structures for vertical tunneling field effect transistors (VFETs) having an oxygen vacancy passivating bottom spacer. In a non-limiting embodiment of the invention, a first semiconductor fin is formed in a first region of a substrate and a second semiconductor fin is formed in a second region of the substrate. A bilayer bottom spacer is formed in direct contact with sidewalls of the semiconductor fins. The bilayer bottom spacer includes a first layer and an oxygen-donating second layer positioned on the first layer. A first dielectric film is formed on the sidewalls of the first semiconductor fin. The first dielectric film terminates on the first layer. A second dielectric film is formed on the sidewalls of the second semiconductor fin. The second dielectric film extends onto a surface of the oxygen-donating second layer.

6 Claims, 17 Drawing Sheets

OXYGEN VACANCY PASSIVATION IN HIGH-K DIELECTRICS FOR VERTICAL TRANSPORT FIELD EFFECT TRANSISTOR

BACKGROUND

The present invention generally relates to fabrication methods and resulting structures for semiconductor devices, and more specifically, to fabrication methods and resulting structures for vertical transport field effect transistors (VFETs) having oxygen vacancy passivation in high-k dielectric regions to reduce p-type FET (pFET) threshold voltage.

Traditional metal oxide semiconductor field effect transistor (MOSFET) fabrication techniques include process flows for constructing planar field effect transistors (FETs). A planar FET includes a substrate (also referred to as a silicon slab), a gate formed over the substrate, source and drain regions formed on opposite ends of the gate, and a channel region near the surface of the substrate under the gate. The channel region electrically connects the source region to the drain region while the gate controls the current in the channel. The gate voltage controls whether the path from drain to source is an open circuit ("off") or a resistive path ("on").

In recent years, research has been devoted to the development of nonplanar transistor architectures. For example, VFETs employ semiconductor fins and side-gates that can be contacted outside the active region, resulting in increased device density and some increased performance over lateral devices. In contrast to planar FETs, the source to drain current in a VFET flows through the vertical fin in a direction that is perpendicular with respect to a horizontal major surface of the wafer or substrate. A VFET can achieve a smaller device footprint because its channel length is decoupled from the contacted gate pitch.

SUMMARY

Embodiments of the invention are directed to a method for forming a semiconductor device. A non-limiting example of the method includes forming a first semiconductor fin in a first region of a substrate and a second semiconductor fin in a second region of the substrate. A bilayer bottom spacer is formed in direct contact with sidewalls of the semiconductor fins. The bilayer bottom spacer includes a first layer and an oxygen-donating second layer positioned on the first layer. A first high-k dielectric film is formed on the sidewalls of the first semiconductor fin. The first high-k dielectric film terminates on the first layer. A second high-k dielectric film is formed on the sidewalls of the second semiconductor fin. The second high-k dielectric film extends onto a surface of the oxygen-donating second layer.

Embodiments of the invention are directed to a method for forming a semiconductor device. A non-limiting example of the method includes forming a first bottom spacer over a substrate. A second bottom spacer is formed on the first bottom spacer. The second bottom spacer includes an oxygen-donating material. A first high-k dielectric film is formed on a channel of a first semiconductor fin and a second high-k dielectric film is formed on a channel of a second semiconductor fin. The first high-k dielectric film is patterned to terminate on the first bottom spacer and the second high-k dielectric film is patterned to extend over a surface of the oxygen-donating material.

Embodiments of the invention are directed to a semiconductor structure. A non-limiting example of the semiconductor device includes a first semiconductor fin in an nFET region of a substrate and a second semiconductor fin in a pFET region of the substrate. A bilayer bottom spacer is positioned in direct contact with sidewalls of the first semiconductor fin and sidewalls of the second semiconductor fin. The bilayer bottom spacer includes a first layer and an oxygen-donating second layer positioned on the first layer. A first high-k dielectric film is formed on the sidewalls of the first semiconductor fin. The first high-k dielectric film terminates on the first layer. A second high-k dielectric film is formed on the sidewalls of the second semiconductor fin. The second high-k dielectric film extends onto a surface of the oxygen-donating second layer.

Additional technical features and benefits are realized through the techniques of the present invention. Embodiments and aspects of the invention are described in detail herein and are considered a part of the claimed subject matter. For a better understanding, refer to the detailed description and to the drawings.

BRIEF DESCRIPTION OF THE DRAWINGS

The specifics of the exclusive rights described herein are particularly pointed out and distinctly claimed in the claims at the conclusion of the specification. The foregoing and other features and advantages of the embodiments of the invention are apparent from the following detailed description taken in conjunction with the accompanying drawings in which:

Figure 1:
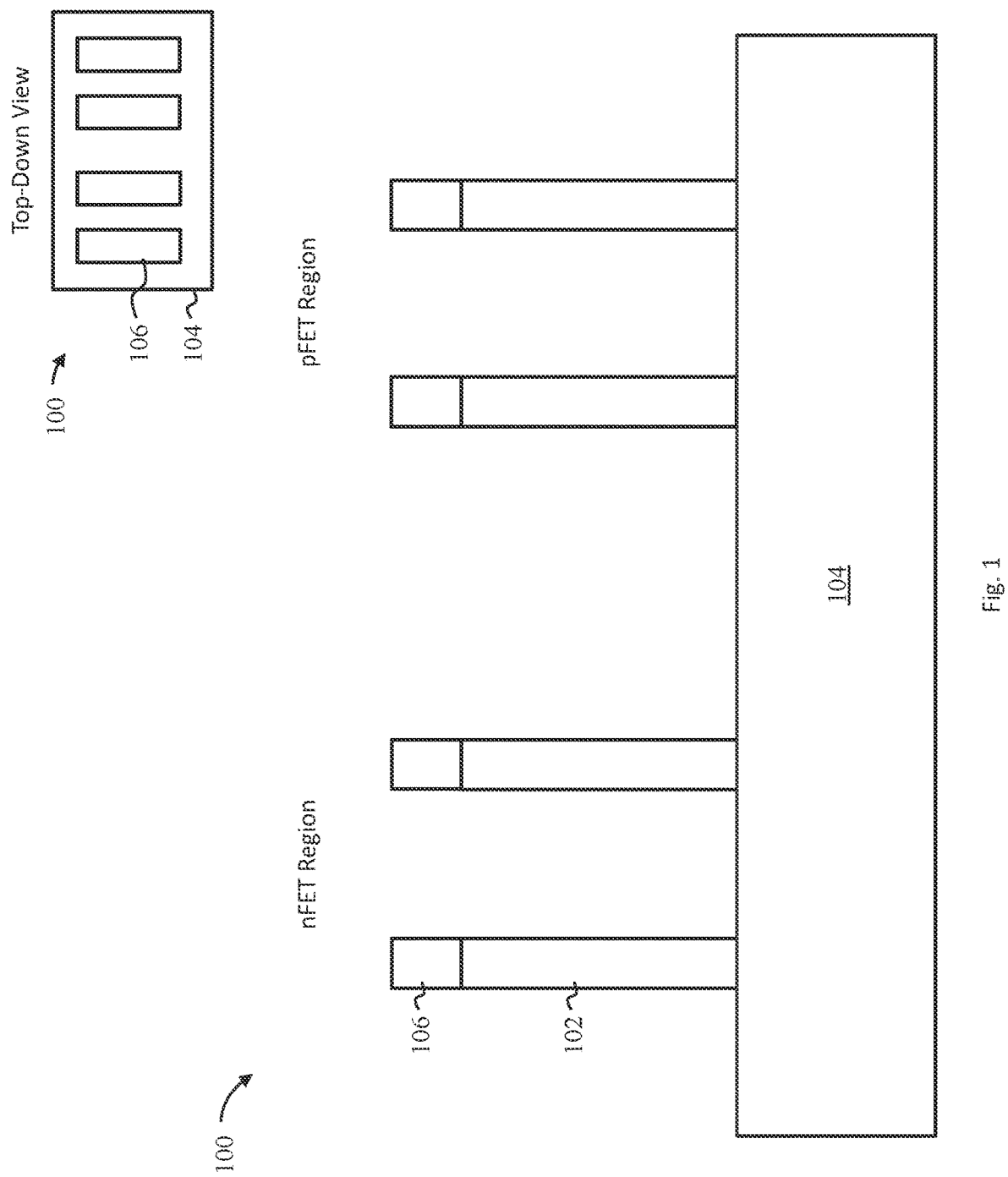
FIG. 1 depicts top-down and cross-sectional views of a semiconductor structure after an initial set of processing operations according to one or more embodiments of the invention.

The diagrams depicted herein are illustrative. There can be many variations to the diagram or the operations described therein without departing from the spirit of the invention. For instance, the actions can be performed in a differing order or actions can be added, deleted or modified.

In the accompanying figures and following detailed description of the described embodiments of the invention, the various elements illustrated in the figures are provided with two or three-digit reference numbers. With minor exceptions, the leftmost digit(s) of each reference number correspond to the figure in which its element is first illustrated.

DETAILED DESCRIPTION

It is understood in advance that although example embodiments of the invention are described in connection with a particular transistor architecture, embodiments of the invention are not limited to the particular transistor architectures or materials described in this specification. Rather, embodiments of the present invention are capable of being implemented in conjunction with any other type of transistor architecture or materials now known or later developed.

For the sake of brevity, conventional techniques related to semiconductor device and integrated circuit (IC) fabrication may or may not be described in detail herein. Moreover, the various tasks and process steps described herein can be incorporated into a more comprehensive procedure or process having additional steps or functionality not described in detail herein. In particular, various steps in the manufacture of semiconductor devices and semiconductor-based ICs are well known and so, in the interest of brevity, many conventional steps will only be mentioned briefly herein or will be omitted entirely without providing the well-known process details.

Turning now to an overview of technologies that are more specifically relevant to aspects of the present invention, continued scaling of VFET devices is restricted in part due to strict constraints on the thermal budget for downstream processing steps as a result of the high-k metal gate (HKMG) module occurring early in the VFET fabrication process. Unfortunately, the thermal budget required for downstream processing steps (e.g. top source/drain epitaxy, dopant driving anneal for junction formation, etc.) increases the pFET threshold voltage, lowering device performance. In particular, pFET threshold voltage increases steadily with anneal temperature. For example, at 640° C. (a typical epitaxy temperature) the pFET threshold voltage increases by ~150 mV.

Turning now to an overview of aspects of the present invention, one or more embodiments of the invention address the above-described shortcomings of the prior art by providing a fabrication method and resulting VFET structure having a bilayer bottom spacer configured to reduce pFET threshold voltages. In some embodiments of the invention, a high-k extension layer is formed in pFET regions but not in nFET regions. In this manner, the high-k film in the pFET region can extend to the outside of the work function metal of the VFET gate to directly contact a top layer of the bilayer bottom spacer, while the high-k film in nFET region only contacts the bottom layer of the bilayer bottom spacer.

In some embodiments of the invention, the top layer includes an oxygen donator material, such as $SiO_2$, while the bottom layer of the bilayer includes a dielectric material that is not an oxygen donator, such as SiN or SiBCN. The $SiO_2$ bottom spacer can provide oxygen into the high-k film (e.g., $HfO_2$) in the pFET region to passivate any oxygen vacancies formed during thermal processing steps post-gate stack. Without wishing to be bound by theory, the high-k film (e.g., $HfO_2$) acts as a conduit through which the donated oxidizing species diffuses into the active area to passivate the oxygen vacancies, resulting in higher nFET threshold voltages and lower pFET threshold voltages. Accordingly, aspects of the present invention can mitigate the increase in pFET threshold voltage that results from the VFET downstream process flow.

Turning now to a more detailed description of aspects of the present invention, FIG. 1 depicts top-down and cross-sectional views of a semiconductor structure 100 after an initial set of fabrication operations have been applied as part of a method of fabricating a final semiconductor device according to one or more embodiments of the invention. In some embodiments of the invention, the final semiconductor device (shown in FIG. 15) can include a variety of types of MOSFETs, including, for example, non-planar n-type field effect transistors (NFET) and p-type field effect transistors (PFET). For example, the final semiconductor device can be a complementary device having both an n-type VFET region and a p-type VFET region.

In FIG. 1, an initial set of fabrication operations has been used to form the semiconductor structure 100 such that it includes fins 102 formed on a substrate 104, configured and arranged as shown. The fins 102 can be formed on the substrate 104 using known front-end-of-line (FEOL) VFET fabrication techniques. While the semiconductor structure 100 is shown having four fins 102 for ease of illustration, it is understood that any number of fins can be formed over or in the substrate 104. It is further understood that each of the nFET region and pFET region can include any arbitrary number of fins, and in some cases these regions will have the same or a different number of fins.

The substrate 104 and the fins 102 can be made of any suitable semiconductor material, such as, for example, monocrystalline Si, silicon germanium (SiGe), III-V compound semiconductor, II-VI compound semiconductor, or semiconductor-on-insulator (SOI). Group III-V compound semiconductors, for example, include materials having at least one group III element and at least one group V element, such as one or more of aluminum gallium arsenide (AlGaAs), aluminum gallium nitride (AlGaN), aluminum arsenide (AlAs), aluminum indium arsenide (AlIAs), aluminum nitride (AlN), gallium antimonide (GaSb), gallium aluminum antimonide (GaAlSb), gallium arsenide (GaAs), gallium arsenide antimonide (GaAsSb), gallium nitride (GaN), indium antimonide (InSb), indium arsenide (InAs), indium gallium arsenide (InGaAs), indium gallium arsenide phosphide (InGaAsP), indium gallium nitride (InGaN), indium nitride (InN), indium phosphide (InP) and alloy combinations including at least one of the foregoing materials. The alloy combinations can include binary (two elements, e.g., gallium (III) arsenide (GaAs)), ternary (three elements, e.g., InGaAs) and quaternary (four elements, e.g., aluminum gallium indium phosphide (AlInGaP)) alloys.

In some embodiments of the invention, the substrate 104 and the fins 102 can be made of a same semiconductor material. In other embodiments of the invention, the substrate 104 can be made of a first semiconductor material, and the fins 102 can be made of a second semiconductor material. In some embodiments of the invention, the substrate 104 and the fins 102 can be made of silicon or SiGe. In some embodiments of the invention, the substrate 104 is a silicon substrate and the fins 102 are silicon germanium fins having a germanium concentration of about 10 to about 80 percent. The fins 102 can each have a height ranging from 4 nm to 150 nm. In some embodiments of the present invention, the fins 102 are formed to a height of about 60 nm, although other fin heights are within the contemplated scope of the invention.

In some embodiments of the invention, the substrate 104 can include a buried oxide layer (not depicted). The buried oxide layer can be made of any suitable dielectric material, such as, for example, a silicon oxide. In some embodiments of the invention, the buried oxide layer is formed to a thickness of about 145 nm, although other thicknesses are within the contemplated scope of the invention.

In some embodiments of the invention, a hard mask 106 (fin mask) is patterned over a top surface of the fins 102. The hard mask 106 can be formed using any suitable process. In some embodiments of the invention, the hard mask 106 can be formed using, for example, a chemical vapor deposition (CVD), plasma-enhanced CVD (PECVD), ultrahigh vacuum chemical vapor deposition (UHVCVD), rapid thermal chemical vapor deposition (RTCVD), metalorganic chemical vapor deposition (MOCVD), low-pressure chemical vapor deposition (LPCVD), limited reaction processing CVD (LRPCVD), atomic layer deposition (ALD), flowable CVD, spin-on dielectrics, physical vapor deposition (PVD), molecular beam epitaxy (MBE), chemical solution deposition, spin-on dielectrics, or other like process. The hard mask 106 can be made of any suitable dielectric material, such as, for example, a low-k dielectric, a nitride, silicon nitride, silicon oxide, SiON, SiC, SiOCN, or SiBCN. In some embodiments of the invention, the hard mask 106 is a silicon nitride hard mask.

Figure 2:
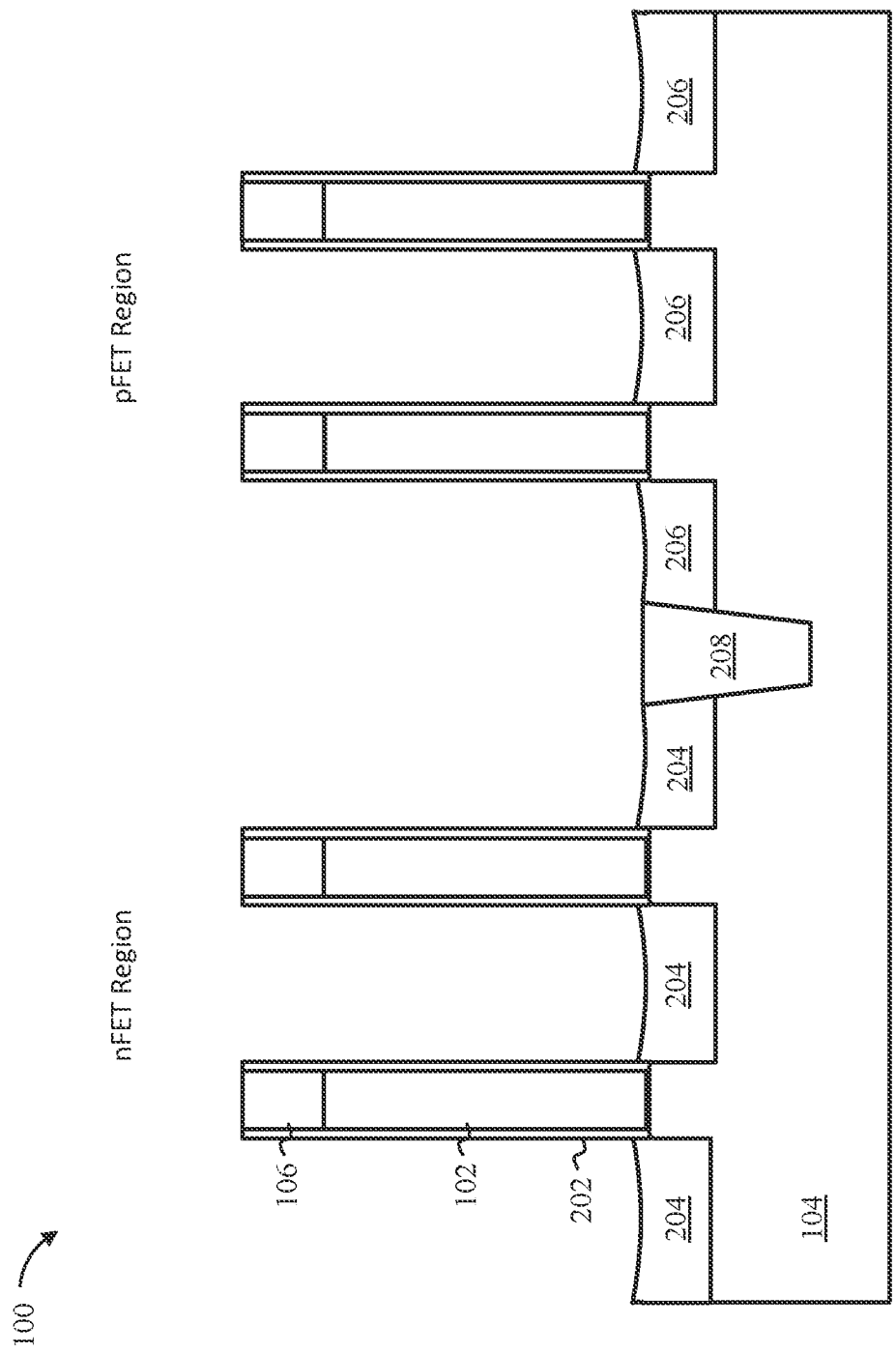
FIG. 2 depicts a cross-sectional view of the semiconductor structure after additional processing operations according to one or more embodiments of the invention.

FIG. 2 depicts a cross-sectional view of the semiconductor structure 100 after a processing operation according to one or more embodiments of the invention. In some embodiments of the invention, spacers 202 are formed on sidewalls of the fins 102. In some embodiments of the invention, the spacers 202 are formed using a chemical vapor deposition (CVD), plasma-enhanced CVD (PECVD), ultrahigh vacuum chemical vapor deposition (UHVCVD), rapid thermal chemical vapor deposition (RTCVD), metalorganic chemical vapor deposition (MOCVD), low-pressure chemical vapor deposition (LPCVD), limited reaction processing CVD (LRPCVD), atomic layer deposition (ALD), physical vapor deposition (PVD), chemical solution deposition, molecular beam epitaxy (MBE), or other like process in combination with a wet or dry etch process. For example, spacer material can be conformally deposited over the semiconductor structure 100 and selectively removed using a RIE to form the spacers 202.

The spacers 202 can be made of any suitable material, such as, for example, a low-k dielectric, a nitride, silicon nitride, silicon oxide, SiON, SiC, SiOCN, or SiBCN. In some embodiments of the invention, the spacers 202 include silicon nitride. The spacers 202 can be formed to a thickness of about 1 to 15 nm, although other thicknesses are within the contemplated scope of the invention.

In some embodiments of the invention, first bottom source or drain (S/D) regions 204 are formed at a base of the fins 102 in the nFET Region of the substrate 104. Similarly, second bottom S/D regions 206 are formed at a base of the fins 102 in the pFET Region of the substrate 104.

In some embodiments of the invention, after forming the spacers 202, the substrate 104 at the base of the fins 102 is recessed and the bottom S/D regions 204 and 206 are epitaxially grown on the recessed surfaces of the substrate 104 (e.g., bottom-up epitaxial growth). In some embodiments of the invention, the S/D regions 204 and 206 are formed to a thickness of about 5 nm to about 60 nm, for example 30 nm, although other thicknesses are within the contemplated scope of the invention.

The S/D regions 204 and 206 can be epitaxially grown using, for example, vapor-phase epitaxy (VPE), molecular beam epitaxy (MBE), liquid-phase epitaxy (LPE), or other suitable processes. The S/D regions 204 and 206 can be semiconductor materials epitaxially grown from gaseous or liquid precursors.

In some embodiments of the invention, the gas source for the epitaxial deposition of semiconductor material includes a silicon containing gas source, a germanium containing gas source, or a combination thereof. For example, a silicon layer can be epitaxially deposited (or grown) from a silicon gas source that is selected from the group consisting of silane, disilane, trisilane, tetrasilane, hexachlorodisilane, tetrachlorosilane, dichlorosilane, trichlorosilane, methylsilane, dimethylsilane, ethylsilane, methyldisilane, dimethyldisilane, hexamethyldisilane and combinations thereof. A germanium layer can be epitaxially deposited from a germanium gas source that is selected from the group consisting of germane, digermane, halogermane, dichlorogermane, trichlorogermane, tetrachlorogermane and combinations thereof. A silicon germanium alloy layer can be epitaxially formed utilizing a combination of such gas sources. Carrier gases like hydrogen, nitrogen, helium and argon can be used. In some embodiments of the invention, the epitaxial semiconductor materials include carbon doped silicon (Si:C). This Si:C layer can be grown in the same chamber used for other epitaxy steps or in a dedicated Si:C epitaxy chamber. The Si:C can include carbon in the range of about 0.2 percent to about 3.0 percent.

Epitaxially grown silicon and silicon germanium can be doped by adding n-type dopants (e.g., P or As) or p-type dopants (e.g., Ga, B, $BF_2$, or Al). In some embodiments of the invention, the S/D regions 204 and 206 can be epitaxially formed and doped by a variety of methods, such as, for example, in-situ doped epitaxy (doped during deposition), doped following the epitaxy, or by implantation and plasma doping. The dopant concentration in the doped regions can range from $1\times10^{19}$ $cm^{-3}$ to $2\times10^{21}$ $cm^{-3}$, or between $1\times10^{20}$ $cm^{-3}$ and $1\times10^{21}$ $cm^{-3}$.

In some embodiments of the invention, the S/D regions 204 are made of silicon, while the S/D regions 206 are made of silicon germanium. In some embodiments of the invention, the S/D regions 204 are doped with an n-type dopant, such as phosphorus. In some embodiments of the invention, the S/D regions 206 are doped with a p-type dopant, such as boron.

As further shown in FIG. 2, a shallow trench isolation region 208 can be formed in the substrate 104. The shallow trench isolation region 208 provides electrical isolation between adjacent devices on the substrate 104. In some embodiments of the invention, the shallow trench isolation region 208 is recessed below a bottommost surface of the S/D regions 204 and 206. The shallow trench isolation region 208 can be formed by forming a trench in the substrate 104 and filling the trench with dielectric material, such as, for example, a low-k dielectric, an oxide, a nitride, silicon nitride, silicon oxide, SiON, SiC, SiOCN, and SiBCN.

Figure 3:
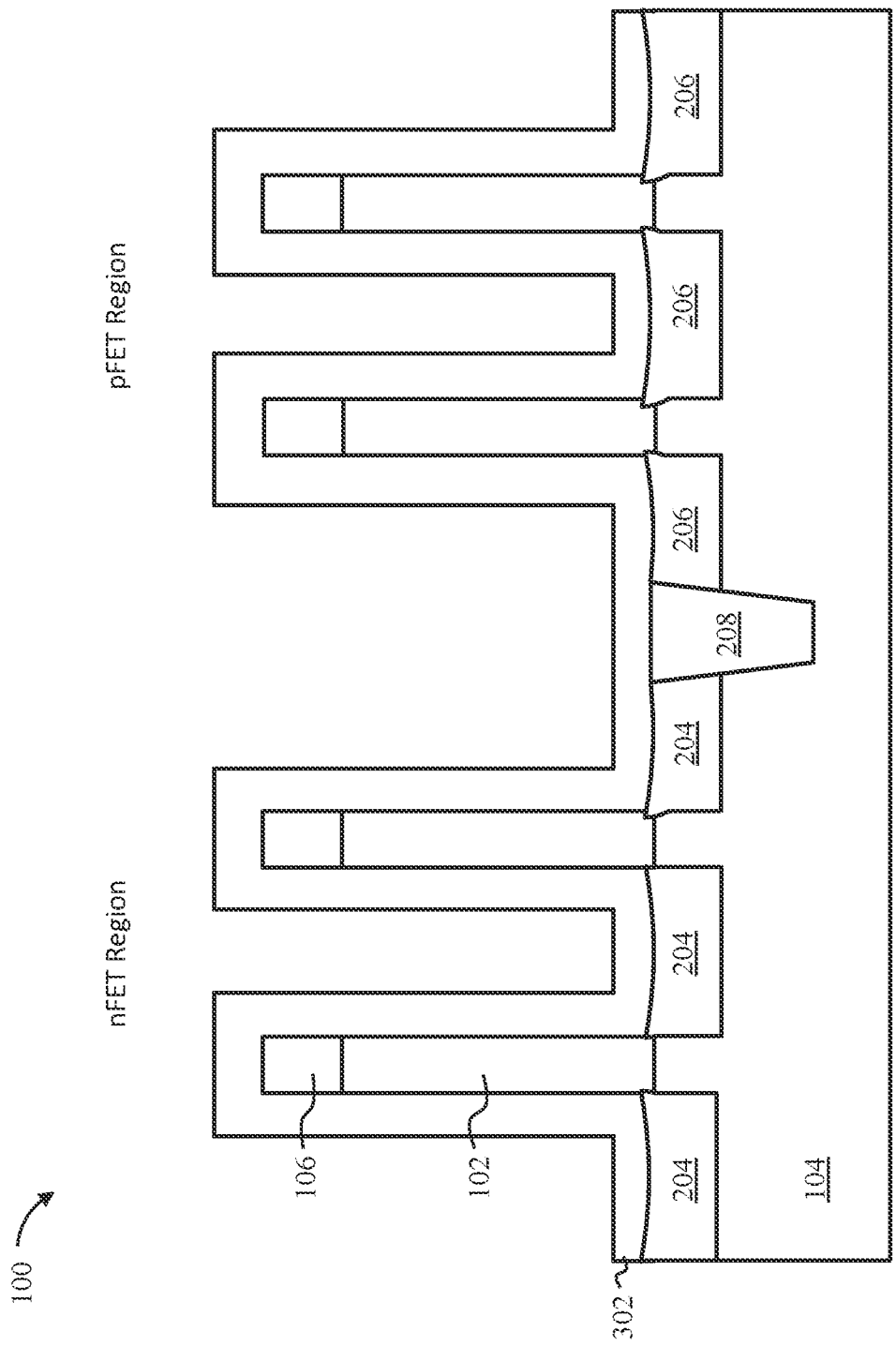
FIG. 3 depicts a cross-sectional view of the semiconductor structure after additional processing operations according to one or more embodiments of the invention.

FIG. 3 depicts a cross-sectional view of the semiconductor structure 100 after a processing operation according to one or more embodiments of the invention. In some embodiments of the invention, the spacers 202 are removed to expose sidewalls of the fins 102, using, for example, a wet etch, a dry etch, an ashing process, and/or a stripping process.

In some embodiments of the invention, a first layer 302 of a bilayer bottom spacer 502 (shown in FIG. 5) is formed over the semiconductor structure 100. In some embodiments of the invention, the first layer 302 is made of a non-oxygen donating dielectric material, such as, for example, SiBCN. The first layer 302 can be formed using any suitable process, such as CVD, PECVD, ALD, flowable CVD, spin-on dielectrics, or PVD. In some embodiments of the invention, the first layer 302 is conformally formed over the semiconductor structure 100.

Figure 4:
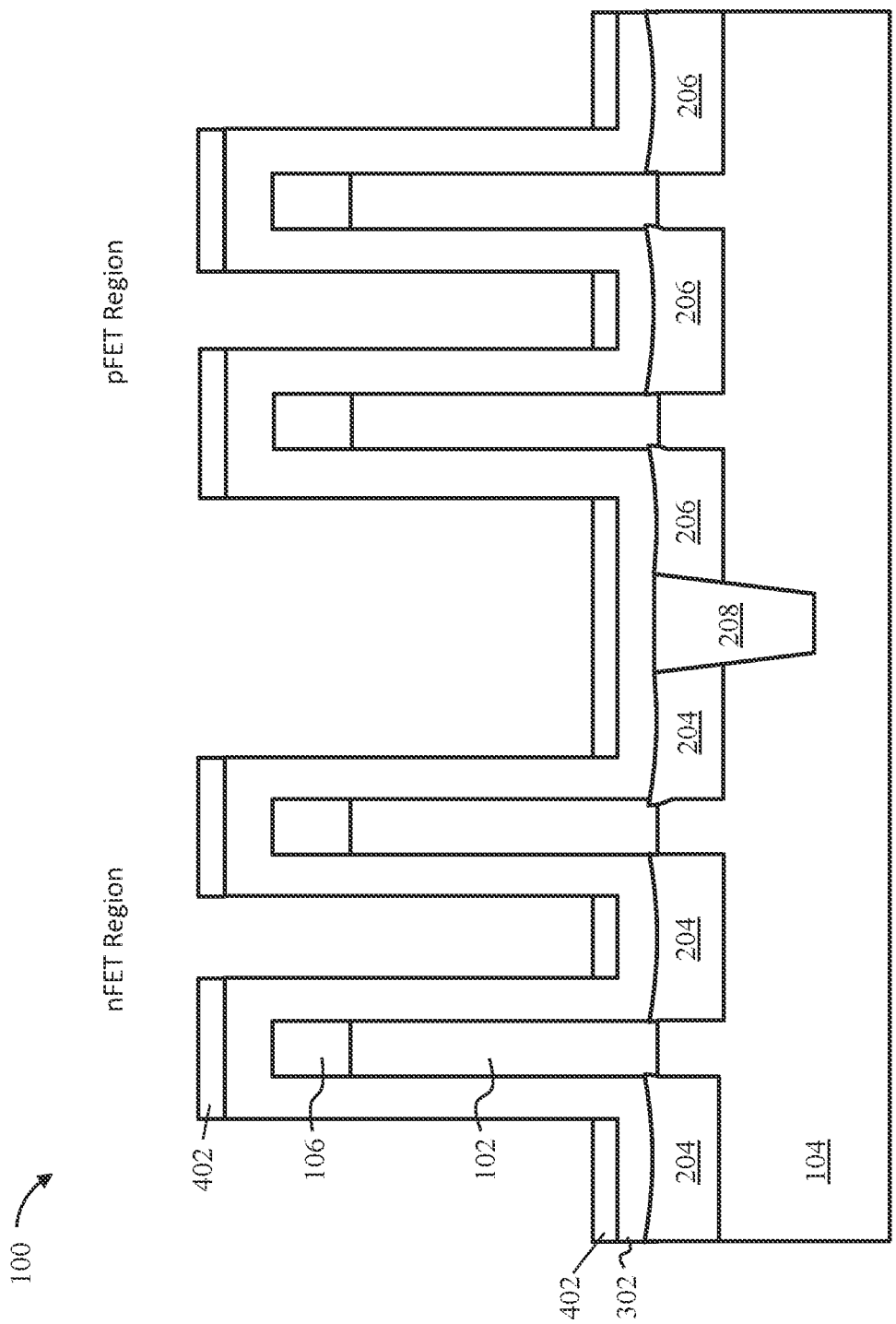
FIG. 4 depicts a cross-sectional view of the semiconductor structure after additional processing operations according to one or more embodiments of the invention.

FIG. 4 depicts a cross-sectional view of the semiconductor structure 100 after a processing operation according to one or more embodiments of the invention. In some embodiments of the invention, a second layer 402 of the bilayer bottom spacer 502 (shown in FIG. 5) is deposited or formed on a top surface of the first layer 302. In some embodiments of the invention, the second layer 402 is made of an oxygen donating dielectric material, such as, for example, SiO$_2$. The second layer 402 can be formed using any suitable process, such as CVD, PECVD, ALD, flowable CVD, spin-on dielectrics, or PVD. In some embodiments of the invention, the second layer 402 is formed to a thickness of about 5 nm to about 30 nm, for example 10 nm, although other thicknesses are within the contemplated scope of the invention.

In some embodiments of the invention, the second layer 402 is directionally deposited onto exposed horizontal surfaces of the semiconductor structure 100. In other words, the second layer 402 can be selectively (preferentially) deposited onto the horizontal surfaces of the first layer 302, leaving sidewalls (vertical surfaces) of the first layer 302 exposed.

Figure 5:
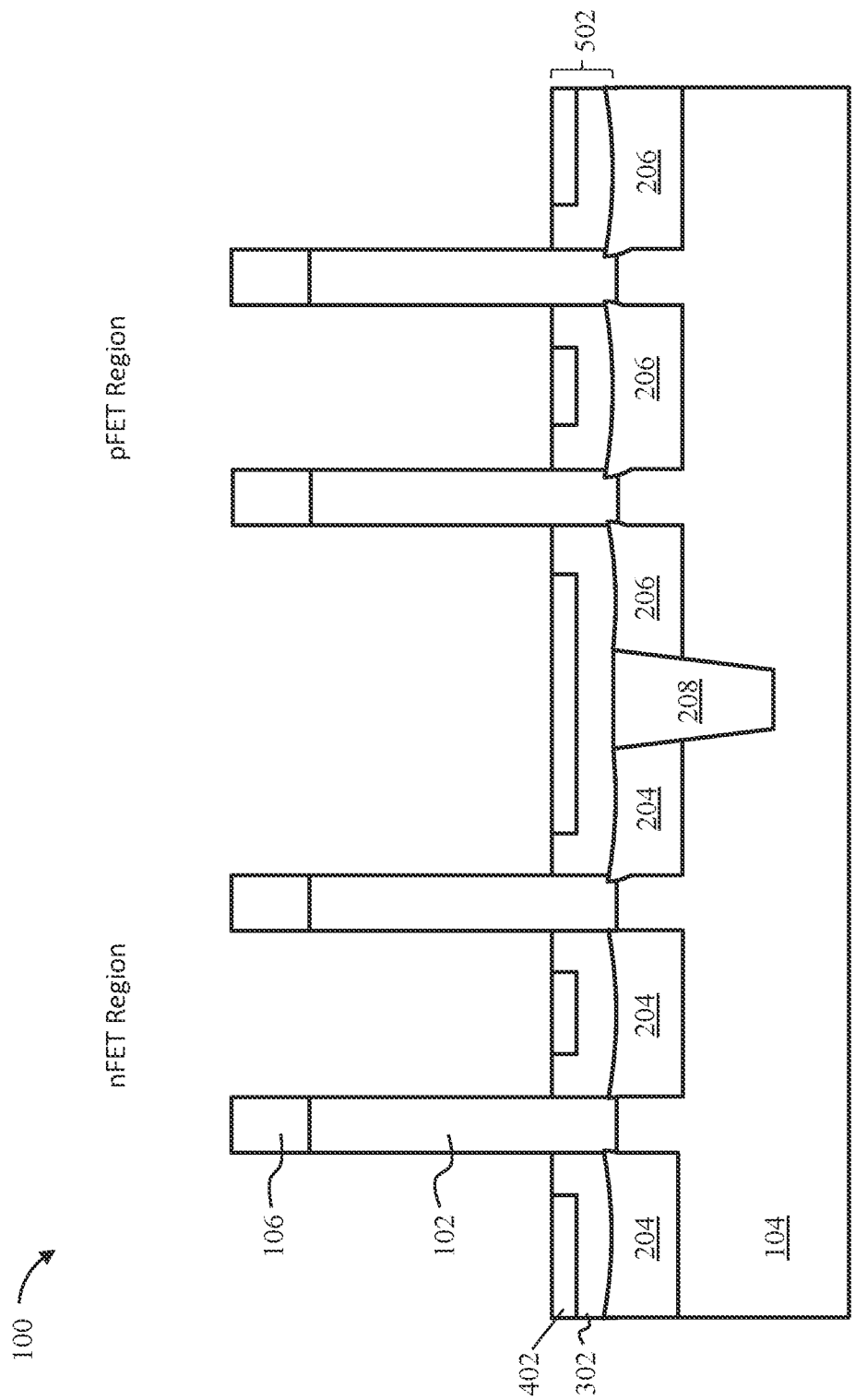
FIG. 5 depicts a cross-sectional view of the semiconductor structure after additional processing operations according to one or more embodiments of the invention.

FIG. 5 depicts a cross-sectional view of the semiconductor structure 100 after a processing operation according to one or more embodiments of the invention. In some embodiments of the invention, portions of the first layer 302 and the second layer 402 are recessed (removed) from the hard mask 106 and sidewalls of the fins 102. As shown in FIG. 5, the remaining portions of the first layer 302 and the second layer 402 define the bilayer bottom spacer 502. In some embodiments of the invention, a topmost surface of the first layer 302 is coplanar to a topmost surface of the second layer 402 after the first layer 302 and the second layer 402 are recessed. The first layer 302 and the second layer 402 can be recessed using any suitable method, such as a wet etch, a dry etch, or a combination of sequential wet and/or dry etches.

Figure 6:
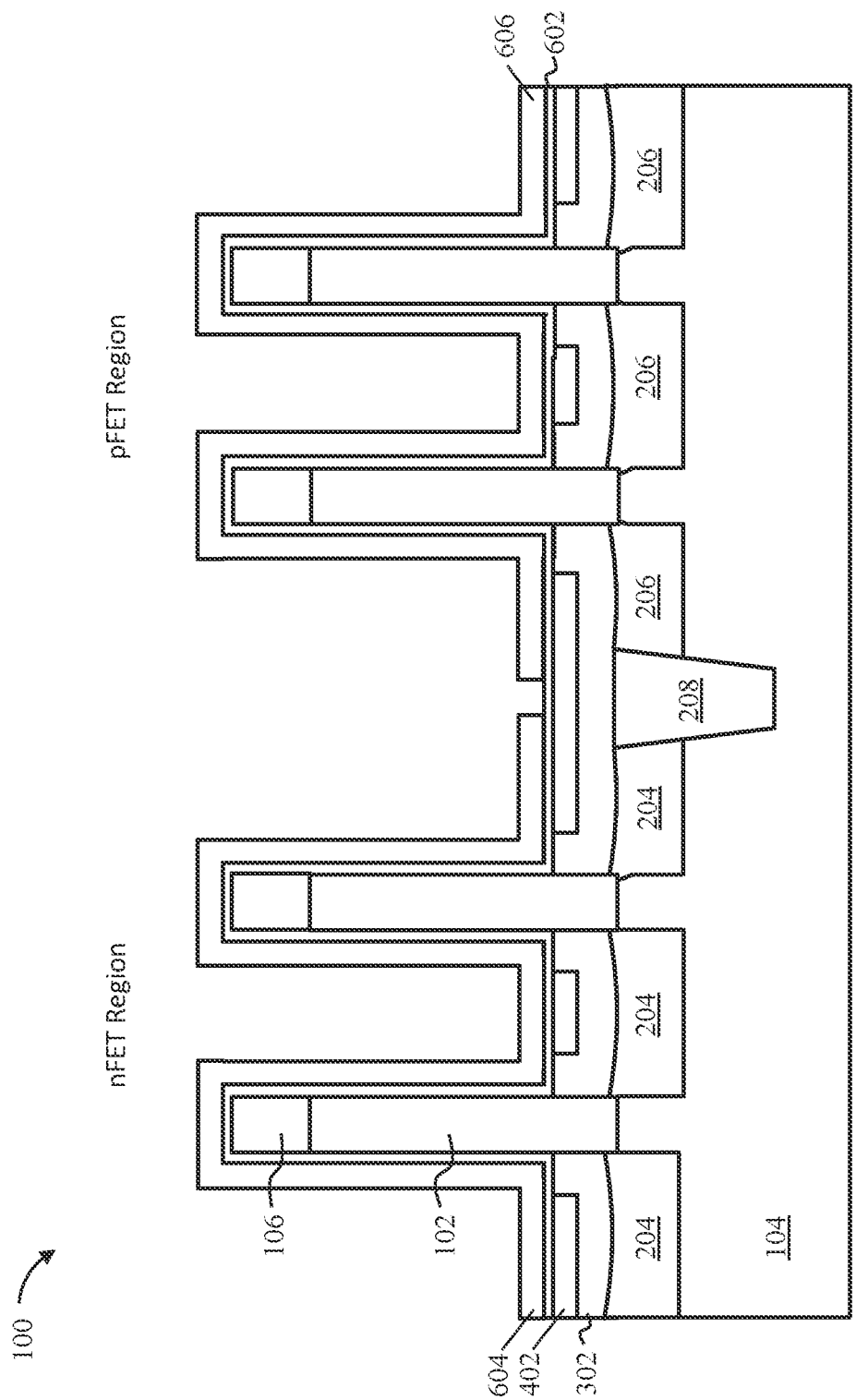
FIG. 6 depicts a cross-sectional view of the semiconductor structure after additional processing operations according to one or more embodiments of the invention.

FIG. 6 depicts a cross-sectional view of the semiconductor structure 100 after a processing operation according to one or more embodiments of the invention. In some embodiments of the invention, a high-k dielectric film 602 (a gate dielectric) is formed over the semiconductor structure 100.

The high-k dielectric film 602 can be made of, for example, silicon oxide, silicon nitride, silicon oxynitride, boron nitride, high-k materials, or any combination of these materials. Examples of high-k materials include but are not limited to metal oxides such as hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, and lead zinc niobate. The high-k materials can further include dopants such as lanthanum and aluminum. In some embodiments of the invention, the high-k dielectric film 602 can have a thickness of about 0.5 nm to about 4 nm. In some embodiments of the invention, the high-k dielectric film 602 includes hafnium oxide and has a thickness of about 1 nm, although other thicknesses are within the contemplated scope of the invention.

In some embodiments of the invention, one or more n-type work function layers 604 (sometimes referred to as a work function metal stack) are formed on the high-k dielectric film 602 in the nFET Region of the substrate 104. In some embodiments of the invention, one or more p-type work function layers 606 are formed on the high-k dielectric film 602 in the pFET Region of the substrate 104.

The work function layers 604 and 606 can be made of, for example, aluminum, lanthanum oxide, magnesium oxide, strontium titanate, strontium oxide, titanium nitride, tantalum nitride, hafnium nitride, tungsten nitride, molybdenum nitride, niobium nitride, hafnium silicon nitride, titanium aluminum nitride, tantalum silicon nitride, titanium aluminum carbide, tantalum carbide, and combinations thereof. The work function layers 604 and 606 can be formed to a thickness of about 0.5 to 6 nm, although other thicknesses are within the contemplated scope of the invention. In some embodiments of the invention, each of the work function layers 604 and 606 can be formed to a different thickness. The number of layers in the work function layers 604 and 606 can be the same or different. For example, in some embodiments of the invention, the work function layers 604 include a TiN/TiAlC/TiN stack, while the work function layers 606 include only a single TiN layer.

Figure 7:
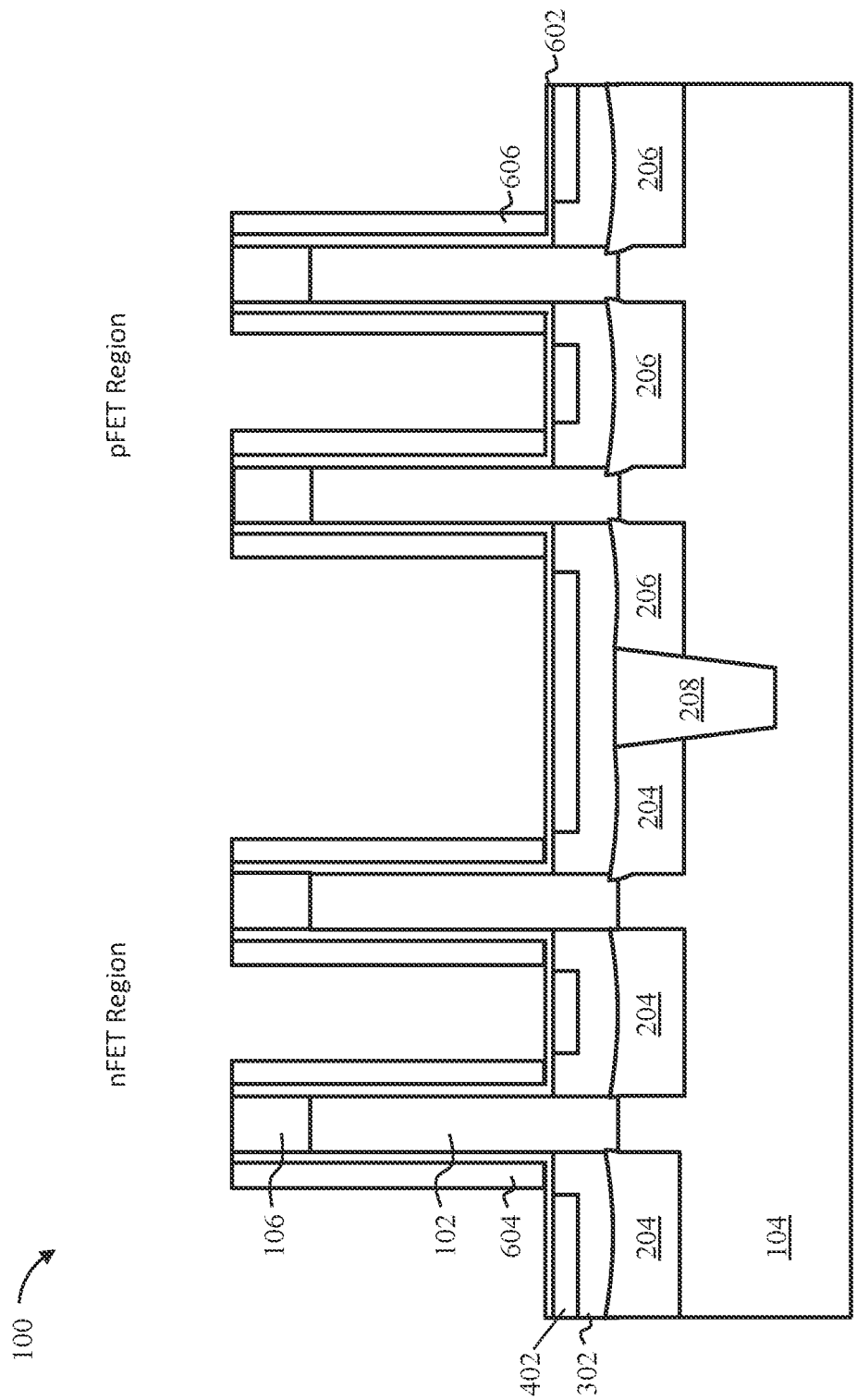
FIG. 7 depicts a cross-sectional view of the semiconductor structure after additional processing operations according to one or more embodiments of the invention.

FIG. 7 depicts a cross-sectional view of the semiconductor structure 100 after a processing operation according to one or more embodiments of the invention. In some embodiments of the invention, portions of the work function layers 604 and 606 and the high-k dielectric film 602 are recessed (removed) to expose top surfaces of the hard mask 106. The work function layers 604 and 606 and the high-k dielectric film 602 can be recessed using any suitable method, such as a wet etch, a dry etch, or a combination of sequential wet and/or dry etches. In some embodiments of the invention, the work function layers 604 and 606 and the high-k dielectric film 602 are removed using a directional reactive ion etch (RIE). In some embodiments of the invention, the RIE is selective to the hard mask 106. In other words, the RIE can stop on the hard mask 106.

Figure 8:
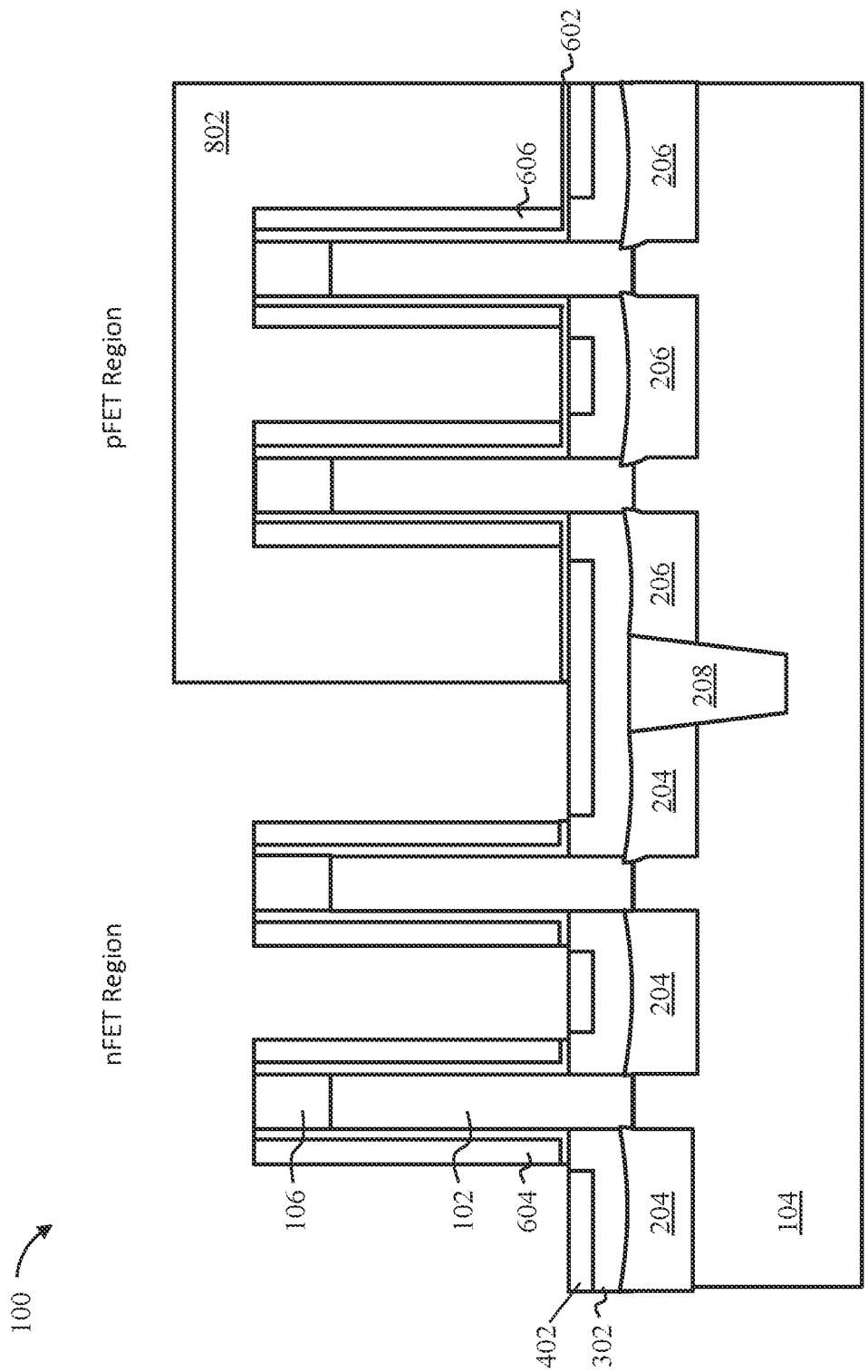
FIG. 8 depicts a cross-sectional view of the semiconductor structure after additional processing operations according to one or more embodiments of the invention.

FIG. 8 depicts a cross-sectional view of the semiconductor structure 100 after a processing operation according to one or more embodiments of the invention. In some embodiments of the invention, a mask 802 is formed over the pFET Region to cover portions of the high-k dielectric film 602. The mask 802 can be made of any suitable masking material, such as, for example, an optical dispersive layer (ODL) or organic planarization layer (OPL).

In some embodiments of the invention, the mask 802 is patterned to open the nFET Region of the substrate 104. In some embodiments of the invention, exposed portions of the high-k dielectric film 602 in the nFET Region are removed.

The high-k dielectric film 602 can be removed using any suitable method, such as a wet etch, a dry etch, or a combination of sequential wet and/or dry etches. In some embodiments of the invention, the high-k dielectric film 602 is removed using a RIE selective to the work function layers 604 and/or the mask 802.

Figure 9:
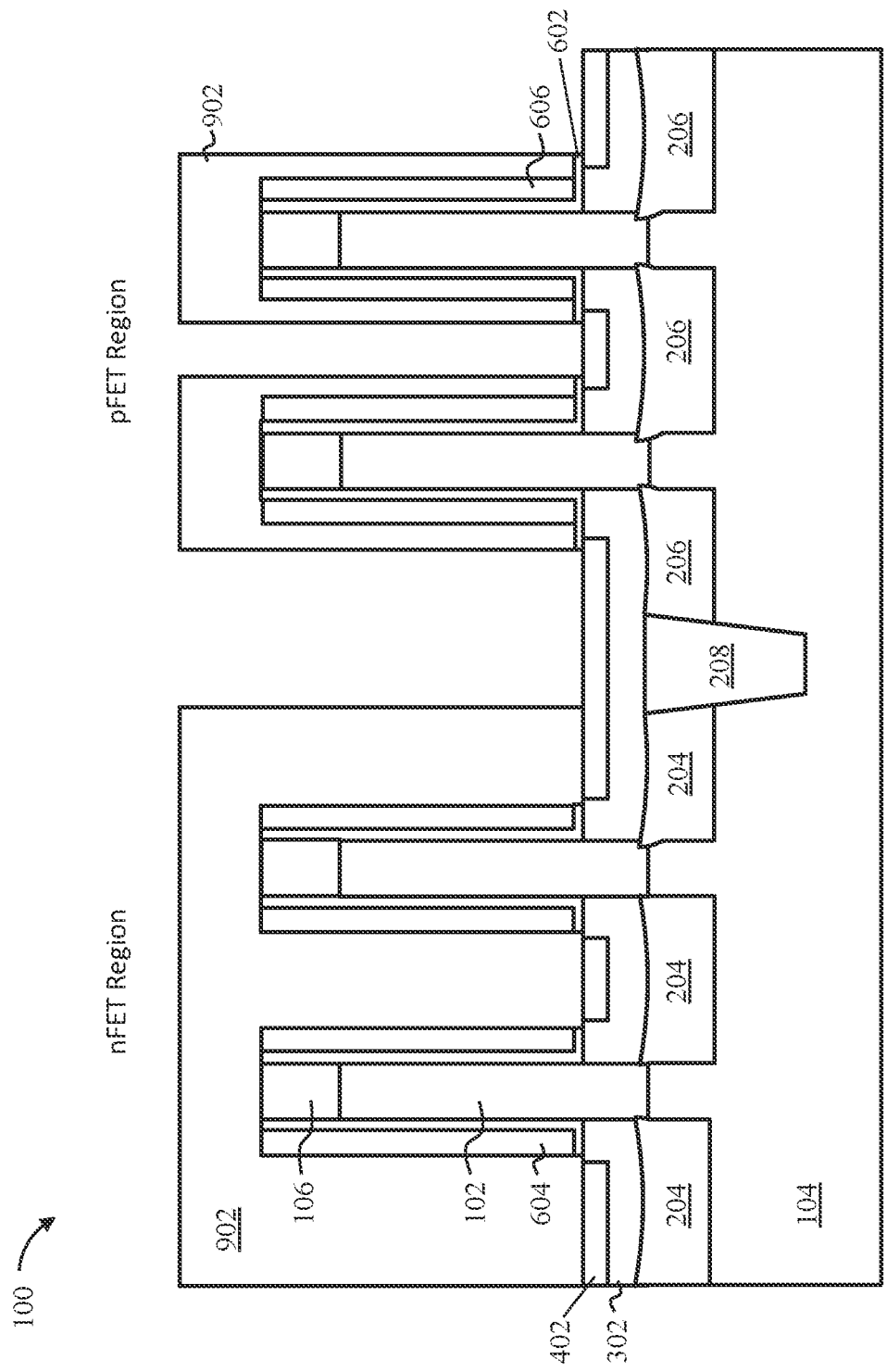
FIG. 9 depicts a cross-sectional view of the semiconductor structure after additional processing operations according to one or more embodiments of the invention.

FIG. 9 depicts a cross-sectional view of the semiconductor structure 100 after a processing operation according to one or more embodiments of the invention. In some embodiments of the invention, the mask 802 is replaced with a mask 902 that is formed over the nFET Region to cover portions of the high-k dielectric film 602. The mask 902 can be made of any suitable masking material, such as, for example, an optical dispersive layer (ODL) or organic planarization layer (OPL).

As shown in FIG. 9, in some embodiments of the invention, the mask 902 is patterned to partially open the pFET Region of the substrate 104 such that portions of the mask 902 vertically overlap a portion of the second layer 402 of the bilayer bottom spacer 502. In some embodiments of the invention, exposed portions of the high-k dielectric film 602 in the pFET Region are removed. In this manner, remaining portions of the high-k dielectric film 602 in the pFET Region extend over the second layer 402. The high-k dielectric film 602 can be removed using any suitable method, such as a wet etch, a dry etch, or a combination of sequential wet and/or dry etches. In some embodiments of the invention, the high-k dielectric film 602 is removed using a RIE selective to the mask 902. In some embodiments of the invention, the mask 902 is patterned cover more or less of the high-k dielectric film 602 in the pFET Region. In this manner, the final degree (length) by which the high-k dielectric film 602 extends over the second layer 402 in the pFET Region can be controlled. As the degree of overlap increases, the pFET threshold voltage increases. Consequently, tuning the pFET threshold voltage can be achieved by varying the amount of overlap between the high-k dielectric film 602 and the second layer 402—which in turn is accomplished by varying the patterning of the mask 902.

Figure 10:
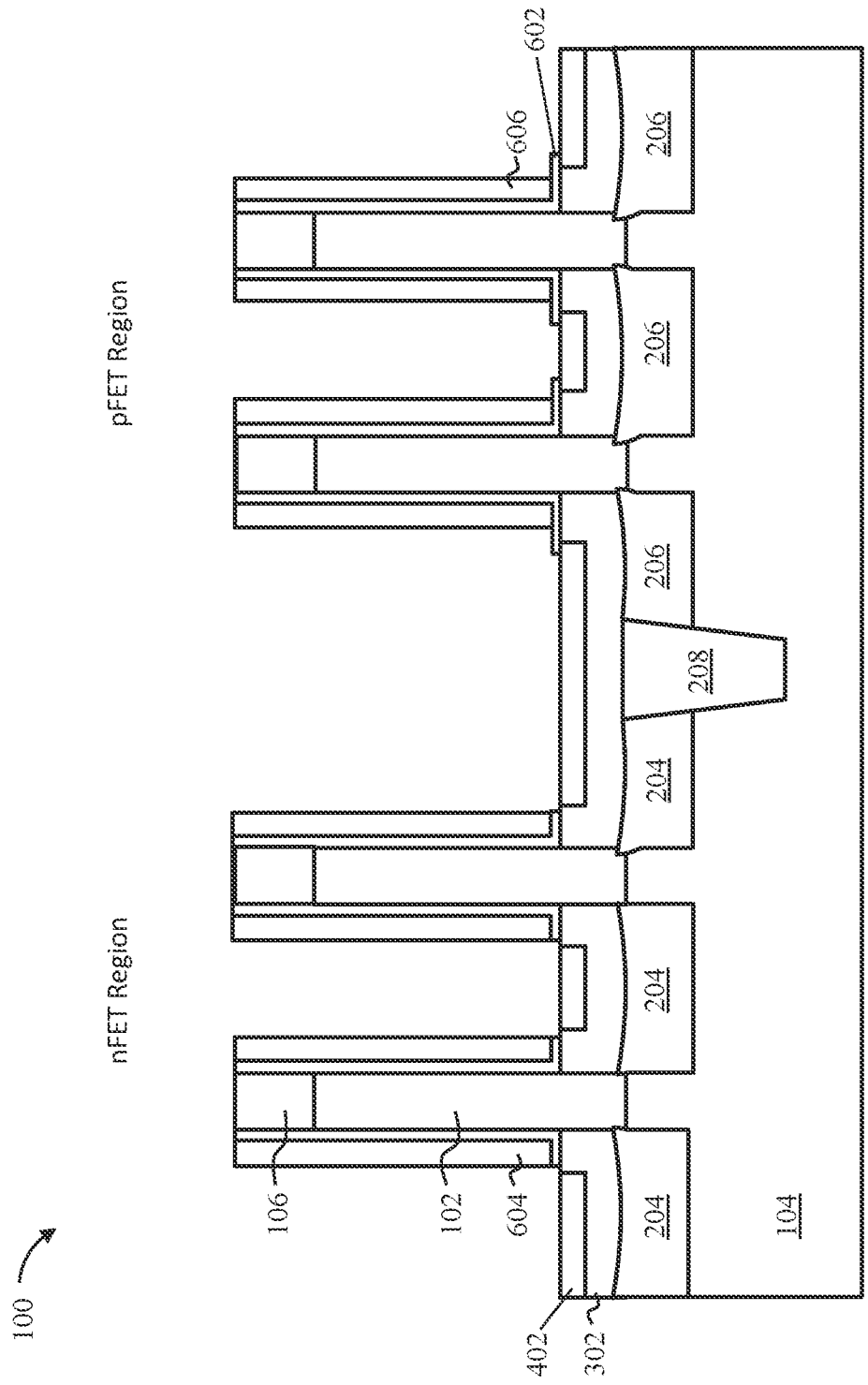
FIG. 10 depicts a cross-sectional view of the semiconductor structure after additional processing operations according to one or more embodiments of the invention.

FIG. 10 depicts a cross-sectional view of the semiconductor structure 100 after a processing operation according to one or more embodiments of the invention. In some embodiments of the invention, the mask 902 is removed. The mask 902 can be removed using any suitable process, such as, for example, a wet etch, a dry etch, an asking process, and/or a stripping process. In some embodiments of the invention, the mask 902 is removed using an OPL ash.

Figure 11:
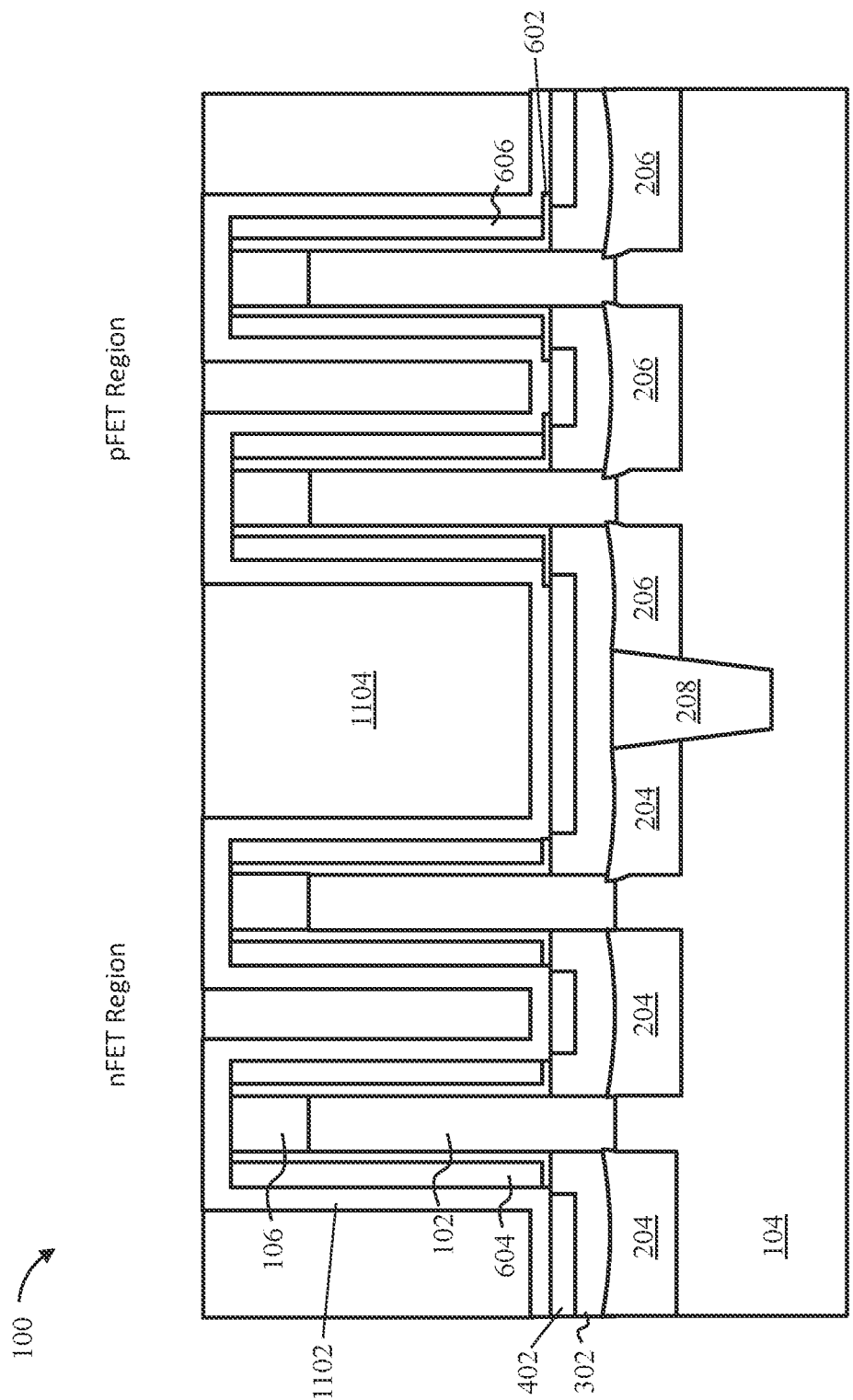
FIG. 11 depicts a cross-sectional view of the semiconductor structure after additional processing operations according to one or more embodiments of the invention.

FIG. 11 depicts a cross-sectional view of the semiconductor structure 100 after a processing operation according to one or more embodiments of the invention. In some embodiments of the invention, a gate encapsulation layer 1102 is formed over the fins 102. In some embodiments of the invention, the gate encapsulation layer 1102 is formed using a CVD, PECVD, UHVCVD, RTCVD, MOCVD, LPCVD, LRPCVD, ALD, PVD, chemical solution deposition, MBE, or other like process. For example, dielectric material can be conformally deposited over the semiconductor structure 100 using CVD.

The gate encapsulation layer 1102 can be made of any suitable material, such as, for example, a low-k dielectric, a nitride, silicon nitride, SiON, SiC, SiOCN, or SiBCN. In some embodiments of the invention, the gate encapsulation layer 1102 can be formed to a thickness of about 1 to 15 nm, although other thicknesses are within the contemplated scope of the invention.

In some embodiments of the invention, an interlayer dielectric 1104 can be formed over the semiconductor structure 100. The interlayer dielectric 1104 serves as an isolation structure for the fins 102. The interlayer dielectric 1104 can be made of any suitable dielectric material, such as, for example, porous silicates, carbon doped oxides, silicon dioxides, silicon nitrides, silicon oxynitrides, silicon carbide (SiC), or other dielectric materials. In some embodiments of the invention, the interlayer dielectric 1104 is made of $SiO_2$. Any known manner of forming the interlayer dielectric 1104 can be utilized, such as, for example, CVD, PECVD, ALD, flowable CVD, spin-on dielectrics, or PVD.

As further shown in FIG. 11, the semiconductor structure 100 can be planarized, using, for example a chemical-mechanical planarization (CMP) process. In some embodiments of the invention, the semiconductor structure 100 is planarized to a surface of the gate encapsulation layer 1102.

Figure 12:
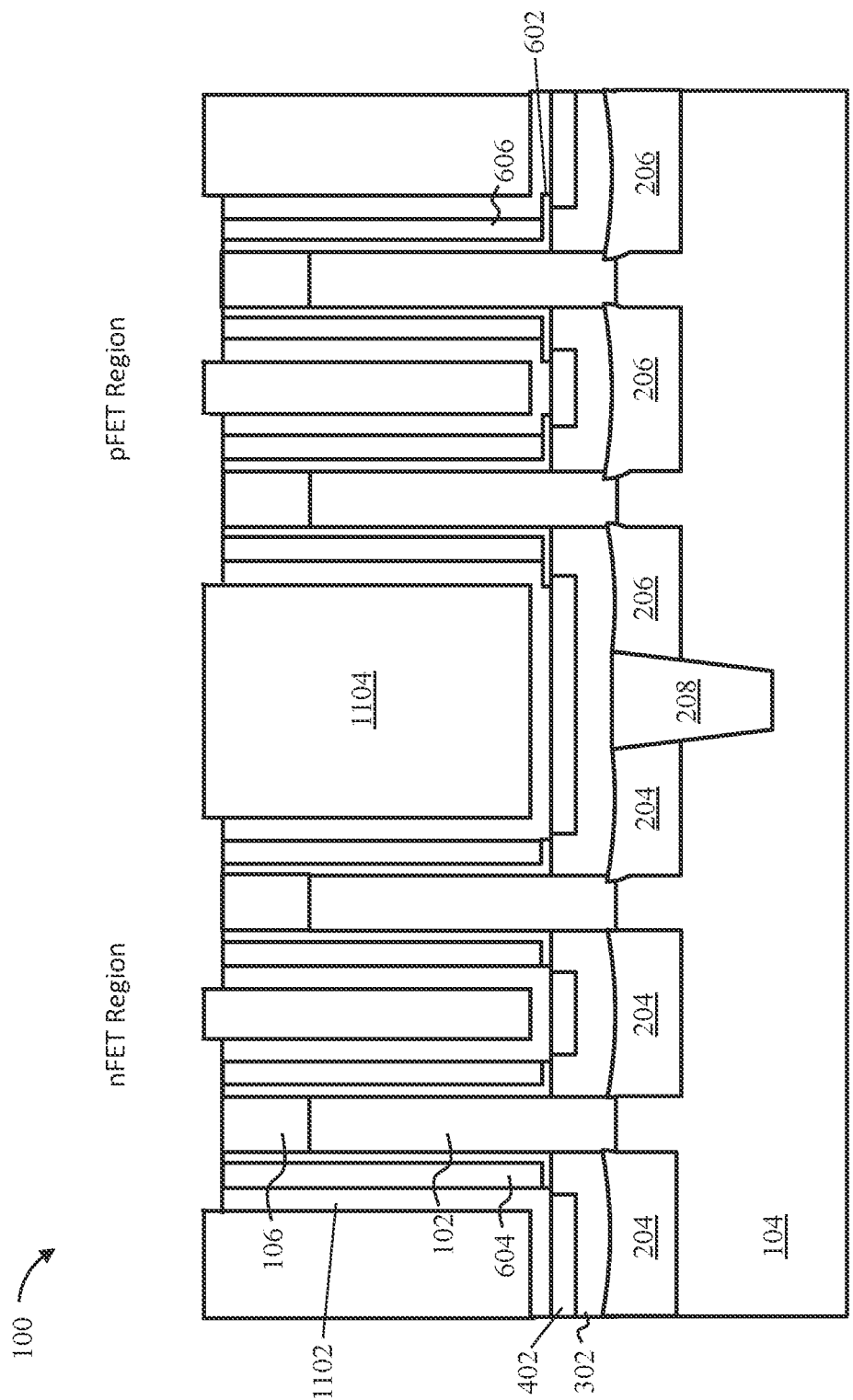
FIG. 12 depicts a cross-sectional view of the semiconductor structure after additional processing operations according to one or more embodiments of the invention.

FIG. 12 depicts a cross-sectional view of the semiconductor structure 100 after a processing operation according to one or more embodiments of the invention. In some embodiments of the invention, portions of the gate encapsulation layer 1102 are removed to expose topmost surfaces of the work function layers 604 and 606. The gate encapsulation layer 1102 can be partially removed (patterned) using any suitable method, such as a wet etch, a dry etch, or a combination of sequential wet and/or dry etches. In some embodiments of the invention, the gate encapsulation layer 1102 is removed using a RIE selective to the work function layers 604 and 606.

Figure 13:
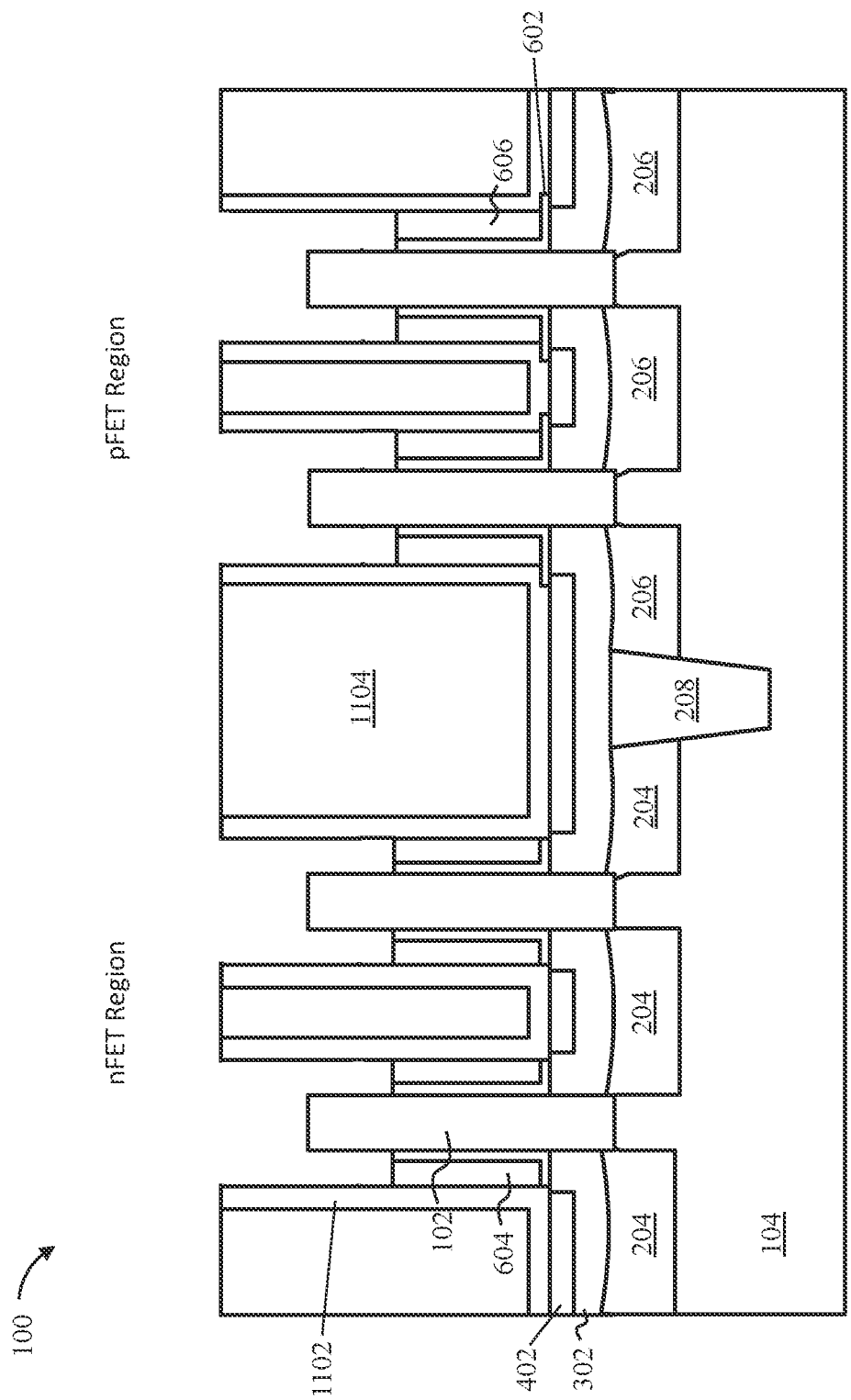
FIG. 13 depicts a cross-sectional view of the semiconductor structure after additional processing operations according to one or more embodiments of the invention.

FIG. 13 depicts a cross-sectional view of the semiconductor structure 100 after a processing operation according to one or more embodiments of the invention. In some embodiments of the invention, the hard mask 106 is removed and portions of the high-k dielectric film 602 and the work function layers 604 and 606 recessed below a topmost surface of the fins 102.

The high-k dielectric film 602 and the work function layers 604 and 606 can be recessed using any suitable method, such as a wet etch, a dry etch, or a combination of sequential wet and/or dry etches. In some embodiments of the invention, the high-k dielectric film 602 and the work function layers 604 and 606 are recessed using a wet chemical etch. In some embodiments of the invention, the high-k dielectric film 602 and the work function layers 604 and 606 are recessed using a wet chemical etch selective to the fins 102 and/or the gate encapsulation layer 1102.

Figure 14:
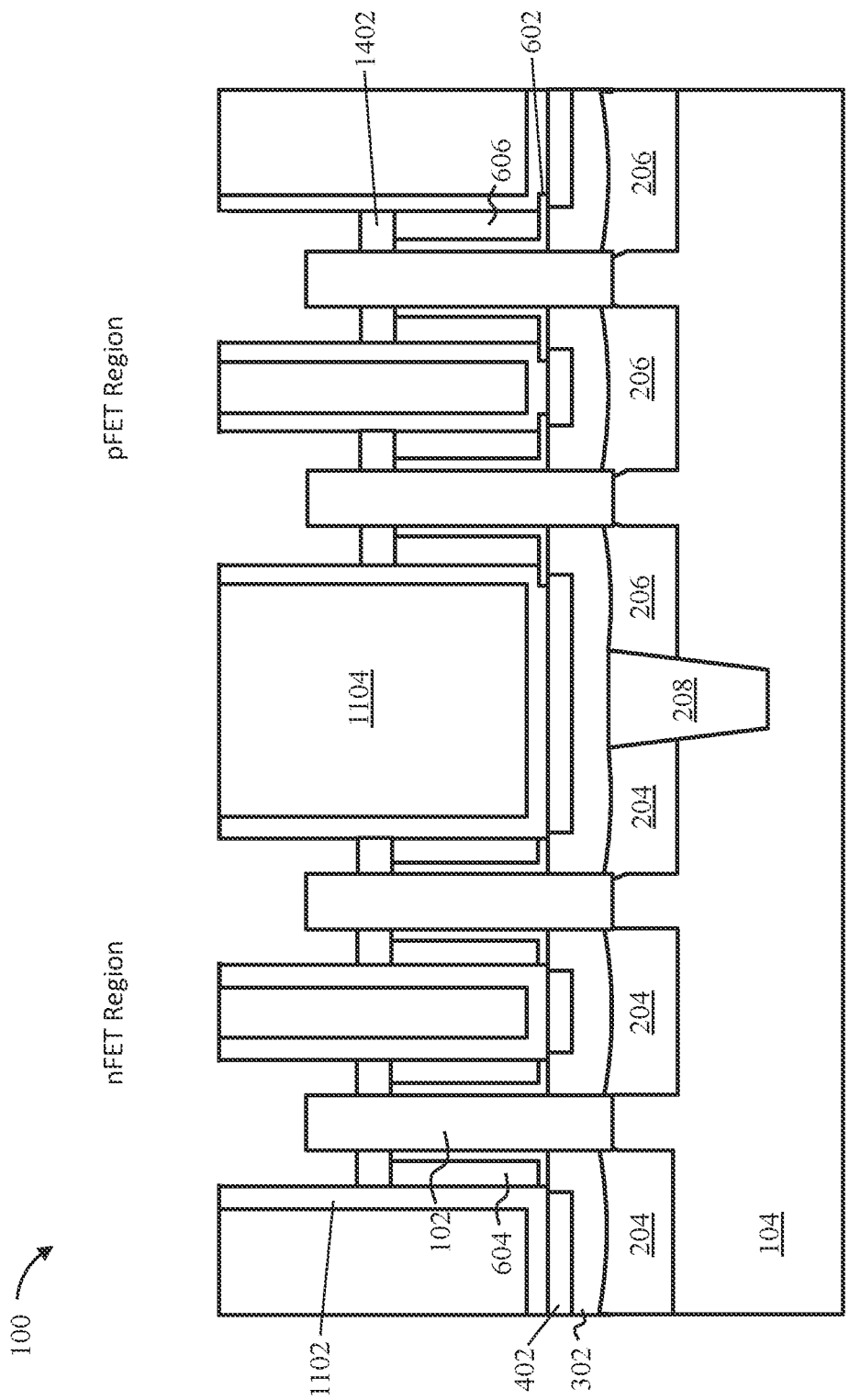
FIG. 14 depicts a cross-sectional view of the semiconductor structure after additional processing operations according to one or more embodiments of the invention.

FIG. 14 depicts a cross-sectional view of the semiconductor structure 100 after a processing operation according to one or more embodiments of the invention. In some embodiments of the invention, a top spacer 1402 can be formed on the recessed surface of the work function layers 604 and 606. The top spacer 1402 can be made of any suitable dielectric material, such as, for example, a low-k dielectric, a nitride, silicon nitride, silicon oxide, SiON, SiC, SiOCN, or SiBCN. In some embodiments of the invention, the top spacer 1402 is made of silicon nitride. The top spacer 1402 can be made using any suitable process. In some embodiments of the invention, the top spacer 1402 is made by divot filling and then etching the overburden.

Figure 15:
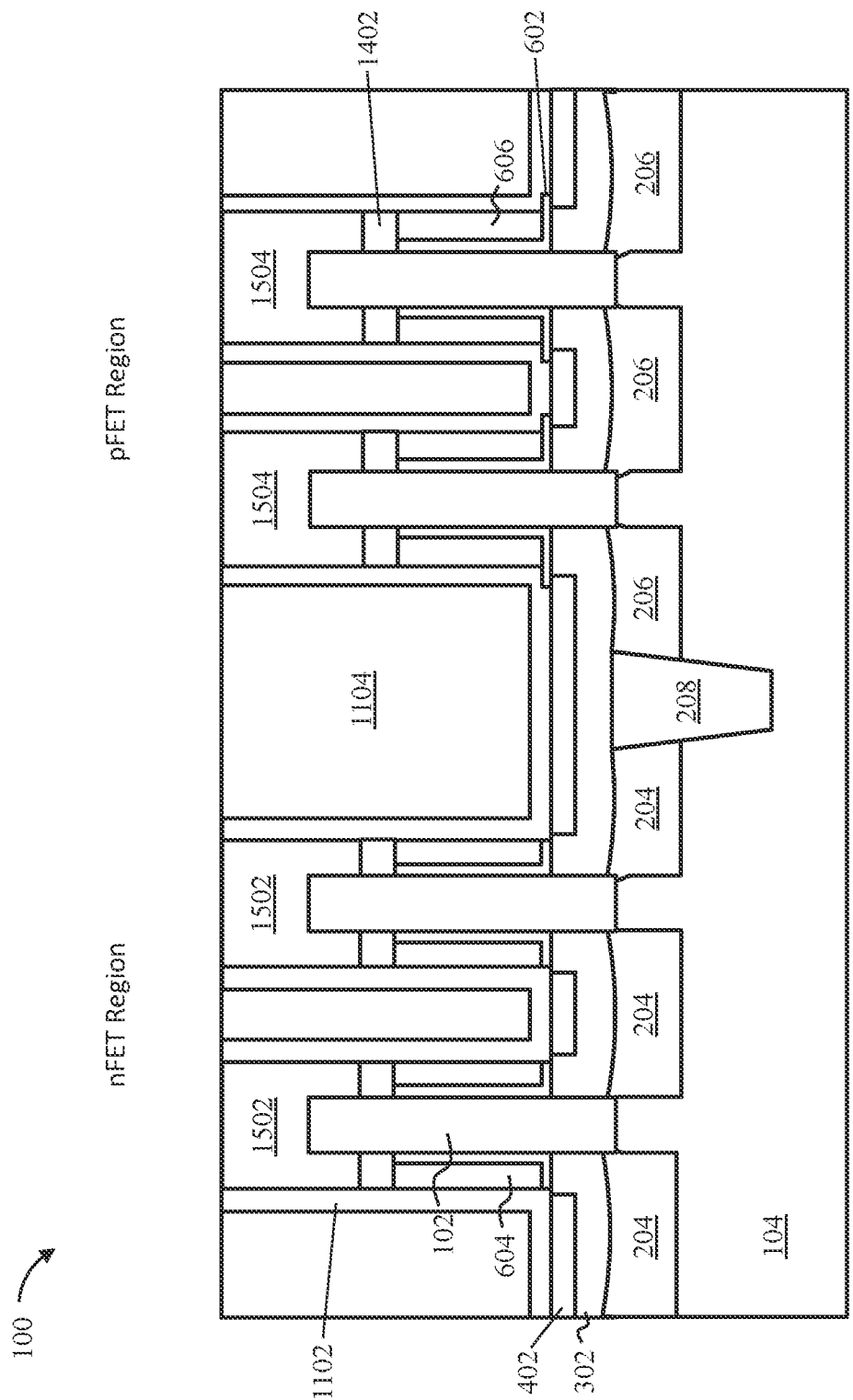
FIG. 15 depicts a cross-sectional view of the semiconductor structure after additional processing operations according to one or more embodiments of the invention.

FIG. 15 depicts a cross-sectional view of the semiconductor structure 100 after a processing operation according to one or more embodiments of the invention. In some embodiments of the invention, first top S/D regions 1502 are formed on a top surface of the fins 102 in the nFET Region of the substrate 104. Similarly, second top S/D regions 1504 are formed on a top surface of the fins 102 in the pFET Region of the substrate 104. The top S/D regions 1502 and 1504 can be formed and doped in a similar manner as the bottom S/D regions 204 and 206.

In some embodiments of the invention, the top S/D regions 1502 and 1504 are epitaxially grown from the exposed top surfaces of the fins 102. In some embodiments of the invention, the top S/D regions 1502 are doped with n-type dopants (e.g., P and As) while the top S/D regions 1504 are doped with p-type dopants (e.g., Ga, B, $BF_2$, and Al). The dopant concentration in the doped regions can range from $1 \times 10^{19}$ cm$^{-3}$ to $2 \times 10^{21}$ cm$^{-3}$, or between $1 \times 10^{20}$ cm$^{-3}$ and $1 \times 10^{21}$ cm$^{-3}$. In some embodiments of the invention, the top S/D regions 1502 are made of silicon, while the top S/D regions 1504 are made of silicon germanium. In some embodiments of the invention, the top S/D regions 1502 are silicon regions doped with phosphorus. In some embodiments of the invention, the top S/D regions 1504 are silicon germanium regions doped with boron.

Figure 16:
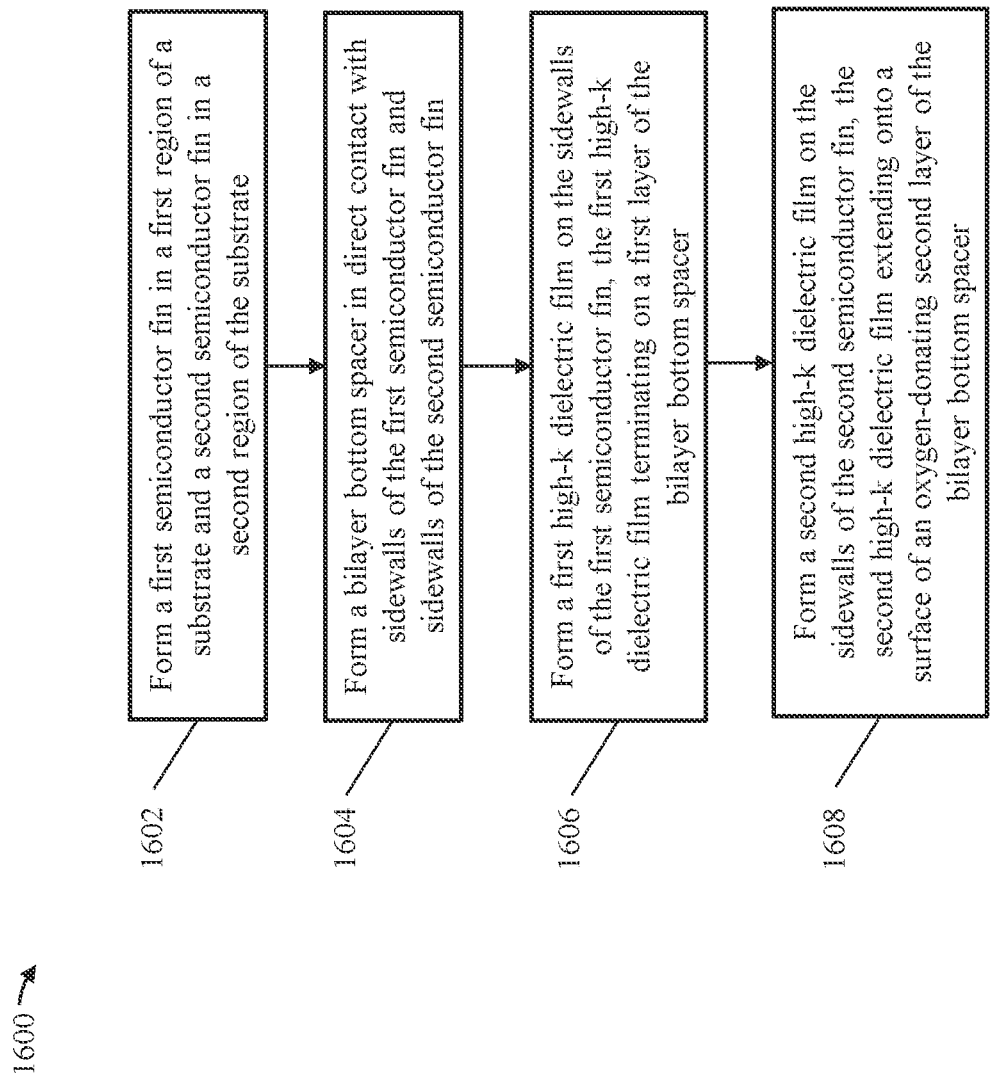
FIG. 16 depicts a flow diagram illustrating a method according to one or more embodiments of the invention.

FIG. 16 depicts a flow diagram 1600 illustrating a method for forming a semiconductor device according to one or more embodiments of the invention. As shown at block 1602, a first semiconductor fin is formed in in a first region of a substrate and a second semiconductor fin is formed in a second region of the substrate. In some embodiments of the invention, the first region of the substrate is an nFET region and the second region of the substrate is a pFET region.

At block 1604, a bilayer bottom spacer is formed in direct contact with sidewalls of the first semiconductor fin and sidewalls of the second semiconductor fin. In some embodiments of the invention, the bilayer bottom spacer includes a first layer and an oxygen-donating second layer positioned on the first layer. In some embodiments of the invention, the first layer includes SiBCN or SiN and the oxygen-donating second layer includes $SiO_2$. In some embodiments of the invention, forming the first layer includes conformally depositing a dielectric material over the first semiconductor fin and the second semiconductor fin. In some embodiments of the invention, an oxygen-donating material is directionally deposited on horizontal surfaces of the first layer. In some embodiments of the invention, the first layer is recessed to a surface of the oxygen-donating second layer.

At block 1606, a first high-k dielectric film is formed on the sidewalls of the first semiconductor fin. The first high-k dielectric film is patterned to terminate on the first layer. At block 1608, a second high-k dielectric film is formed on the sidewalls of the second semiconductor fin. The second high-k dielectric film is patterned to extend onto a surface of the oxygen-donating second layer.

In some embodiments of the invention, forming the second high-k dielectric film includes conformally depositing the second high-k dielectric film over a channel of the second semiconductor fin. In some embodiments of the invention, a mask is formed over the second high-k dielectric film and the mask is patterned such that portions of the mask vertically overlap a portion of the oxygen-donating second layer. In some embodiments of the invention, forming the second high-k dielectric film includes removing portions of the second high-k dielectric film that are not covered by the mask.

Figure 17:
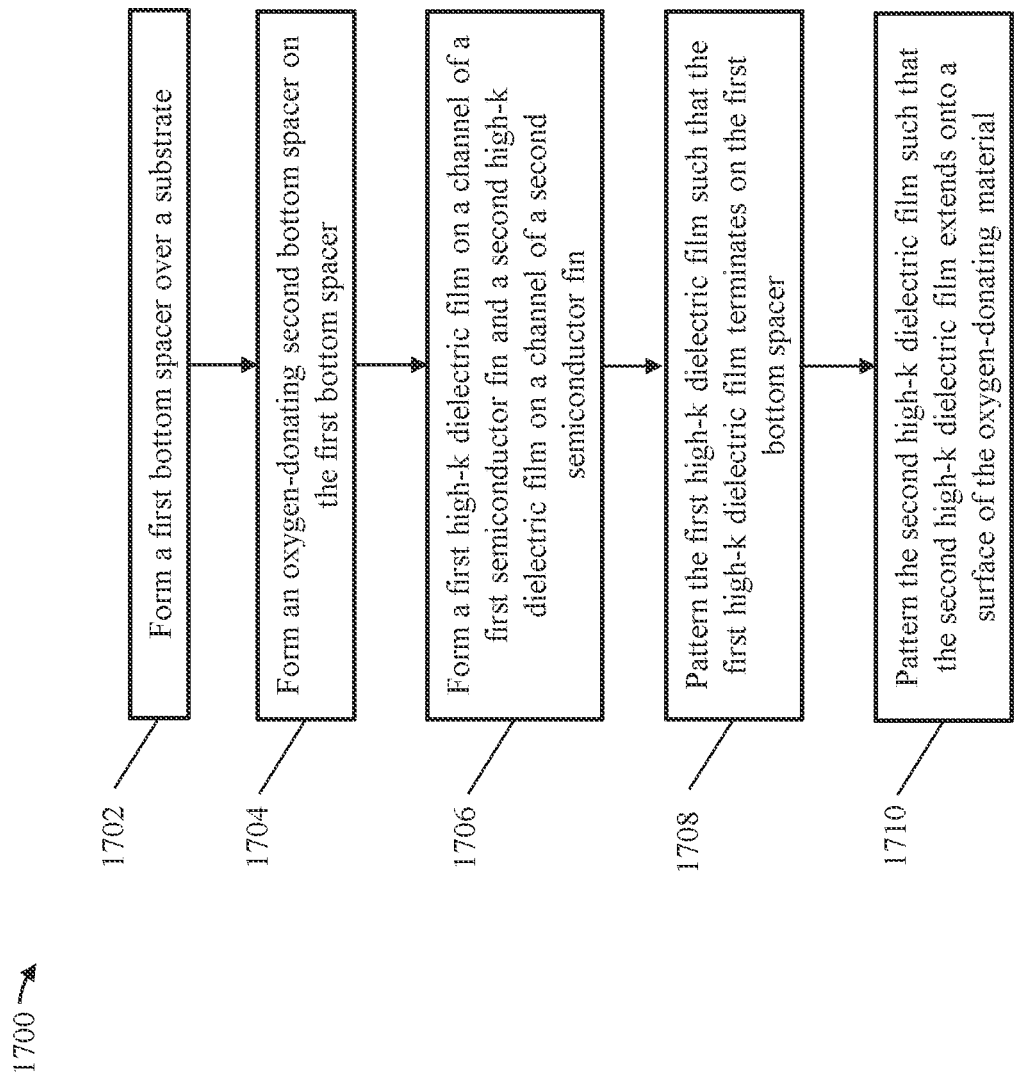
FIG. 17 depicts a flow diagram illustrating a method according to one or more embodiments of the invention.

FIG. 17 depicts a flow diagram 1700 illustrating a method for forming a semiconductor device according to one or more embodiments of the invention. As shown at block 1702, a first bottom spacer is formed over a substrate. In some embodiments of the invention, the first bottom spacer includes an oxygen-lacking dielectric material, such as SiBCN or SiN. In some embodiments of the invention, forming the first bottom spacer includes conformally depositing a dielectric material over the first semiconductor fin and the second semiconductor fin.

At block 1704, a second bottom spacer is formed on the first bottom spacer. The second bottom spacer includes an oxygen-donating material, such as $SiO_2$. In some embodiments of the invention, forming the second bottom spacer includes directionally depositing the oxygen-donating material on horizontal surfaces of the first bottom spacer.

At block 1706, a first high-k dielectric film is formed on a channel of a first semiconductor fin and a second high-k dielectric film is formed on a channel of a second semiconductor fin. At block 1708, the first high-k dielectric film is patterned such that the first high-k dielectric film terminates on the first bottom spacer. At block 1710, the second high-k dielectric film is patterned such that the second high-k dielectric film extends onto a surface of the oxygen-donating material.

The method can include forming a first bottom S/D region on sidewalls of the first semiconductor fin and a second bottom S/D region on sidewalls of the second semiconductor fin. In some embodiments of the invention, the first bottom S/D region includes silicon doped with an n-type dopant and the second bottom S/D region includes silicon germanium doped with a p-type dopant. In some embodiments of the invention, a first top S/D region is formed on a top surface of the first semiconductor fin and a second top S/D region is formed on a top surface of the second semiconductor fin.

The methods and resulting structures described herein can be used in the fabrication of IC chips. The resulting IC chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes IC chips, ranging from toys and other low-end applications to advanced computer products having a display, a keyboard or other input device, and a central processor.

Various embodiments of the present invention are described herein with reference to the related drawings. Alternative embodiments can be devised without departing from the scope of this invention. Although various connections and positional relationships (e.g., over, below, adjacent, etc.) are set forth between elements in the following description and in the drawings, persons skilled in the art will recognize that many of the positional relationships described herein are orientation-independent when the described functionality is maintained even though the orientation is changed. These connections and/or positional relationships, unless specified otherwise, can be direct or indirect, and the present invention is not intended to be limiting in this respect. Similarly, the term "coupled" and variations thereof describes having a communications path between two elements and does not imply a direct connection between the elements with no intervening elements/connections between them. All of these variations are considered a part of the specification. Accordingly, a coupling of entities can refer to either a direct or an indirect coupling, and a positional relationship between entities can be a direct or indirect positional relationship. As an example of an indirect positional relationship, references in the present description to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiments or designs. The terms "at least one" and "one or more" are understood to include any integer number greater than or equal to one, i.e. one, two, three, four, etc. The terms "a plurality" are understood to include any integer number greater than or equal to two, i.e. two, three, four, five, etc. The term "connection" can include an indirect "connection" and a direct "connection."

References in the specification to "one embodiment," "an embodiment," "an example embodiment," etc., indicate that the embodiment described can include a particular feature, structure, or characteristic, but every embodiment may or may not include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper," "lower," "right," "left," "vertical," "horizontal," "top," "bottom," and derivatives thereof shall relate to the described structures and methods, as oriented in the drawing figures. The terms "overlying," "atop," "on top," "positioned on" or "positioned atop" mean that a first element, such as a first structure, is present on a second element, such as a second structure, wherein intervening elements such as an interface structure can be present between the first element and the second element. The term "direct contact" means that a first element, such as a first structure, and a second element, such as a second structure, are connected without any intermediary conducting, insulating or semiconductor layers at the interface of the two elements.

Spatially relative terms, e.g., "beneath," "below," "lower," "above," "upper," and the like, are used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device can be otherwise oriented (e.g., rotated 90 degrees or at other orientations), and the spatially relative descriptors used herein should be interpreted accordingly.

The terms "about," "substantially," "approximately," and variations thereof, are intended to include the degree of error associated with measurement of the particular quantity based upon the equipment available at the time of filing the application. For example, "about" can include a range of ±8% or 5%, or 2% of a given value.

The phrase "selective to," such as, for example, "a first element selective to a second element," means that the first element can be etched and the second element can act as an etch stop.

The term "conformal" (e.g., a conformal layer or a conformal deposition) means that the thickness of the layer is substantially the same on all surfaces, or that the thickness variation is less than 15% of the nominal thickness of the layer.

The terms "epitaxial growth and/or deposition" and "epitaxially formed and/or grown" mean the growth of a semiconductor material (crystalline material) on a deposition surface of another semiconductor material (crystalline material), in which the semiconductor material being grown (crystalline overlayer) has substantially the same crystalline characteristics as the semiconductor material of the deposition surface (seed material). In an epitaxial deposition process, the chemical reactants provided by the source gases can be controlled and the system parameters can be set so that the depositing atoms arrive at the deposition surface of the semiconductor substrate with sufficient energy to move about on the surface such that the depositing atoms orient themselves to the crystal arrangement of the atoms of the deposition surface. An epitaxially grown semiconductor material can have substantially the same crystalline characteristics as the deposition surface on which the epitaxially grown material is formed. For example, an epitaxially grown semiconductor material deposited on a {100} orientated crystalline surface can take on a {100} orientation. In some embodiments of the invention of the invention, epitaxial growth and/or deposition processes can be selective to forming on semiconductor surface, and may or may not deposit material on exposed surfaces, such as silicon dioxide or silicon nitride surfaces.

As previously noted herein, for the sake of brevity, conventional techniques related to semiconductor device and integrated circuit (IC) fabrication may or may not be described in detail herein. By way of background, however, a more general description of the semiconductor device fabrication processes that can be utilized in implementing one or more embodiments of the present invention will now be provided. Although specific fabrication operations used in implementing one or more embodiments of the present invention can be individually known, the described combination of operations and/or resulting structures of the present invention are unique. Thus, the unique combination of the operations described in connection with the fabrication of a semiconductor device according to the present invention utilize a variety of individually known physical and chemical processes performed on a semiconductor (e.g., silicon) substrate, some of which are described in the immediately following paragraphs.

In general, the various processes used to form a microchip that will be packaged into an IC fall into four general categories, namely, film deposition, removal/etching, semiconductor doping and patterning/lithography. Deposition is any process that grows, coats, or otherwise transfers a material onto the wafer. Available technologies include physical vapor deposition (PVD), chemical vapor deposition (CVD), electrochemical deposition (ECD), molecular beam epitaxy (MBE) and more recently, atomic layer deposition (ALD) among others. Removal/etching is any process that removes material from the wafer. Examples include etch processes (either wet or dry), chemical-mechanical planarization (CMP), and the like. Reactive ion etching (RIE), for example, is a type of dry etching that uses chemically reactive plasma to remove a material, such as a masked pattern of semiconductor material, by exposing the material to a bombardment of ions that dislodge portions of the material from the exposed surface. The plasma is typically generated under low pressure (vacuum) by an electromagnetic field. Semiconductor doping is the modification of electrical properties by doping, for example, transistor sources and drains, generally by diffusion and/or by ion implantation. These doping processes are followed by furnace annealing or by rapid thermal annealing (RTA). Annealing serves to activate the implanted dopants. Films of both conductors (e.g., poly-silicon, aluminum, copper, etc.) and insulators (e.g., various forms of silicon dioxide, silicon nitride, etc.) are used to connect and isolate transistors and their components. Selective doping of various regions of the semiconductor substrate allows the conductivity of the substrate to be changed with the application of voltage. By creating structures of these various components, millions of transistors can be built and wired together to form the complex circuitry of a modern microelectronic device. Semiconductor lithography is the formation of three-dimensional relief images or patterns on the semiconductor substrate for subsequent transfer of the pattern to the substrate. In semiconductor lithography, the patterns are formed by a light sensitive polymer called a photo-resist. To build the complex structures that make up a transistor and the many wires that connect the millions of transistors of a circuit, lithography and etch pattern transfer steps are repeated multiple times. Each pattern being printed on the wafer is aligned to the previously formed patterns and slowly the conductors, insulators and selectively doped regions are built up to form the final device.

The flowchart and block diagrams in the Figures illustrate possible implementations of fabrication and/or operation methods according to various embodiments of the present invention. Various functions/operations of the method are represented in the flow diagram by blocks. In some alternative implementations, the functions noted in the blocks can occur out of the order noted in the Figures. For example, two blocks shown in succession can, in fact, be executed substantially concurrently, or the blocks can sometimes be executed in the reverse order, depending upon the functionality involved.

The descriptions of the various embodiments of the present invention have been presented for purposes of illustration, but are not intended to be exhaustive or limited to the embodiments described. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments described herein.

What is claimed is:

1. A semiconductor device comprising:
    a first semiconductor fin in an nFET region of a substrate and a second semiconductor fin in a pFET region of the substrate;
    a bilayer bottom spacer in direct contact with sidewalls of the first semiconductor fin and sidewalls of the second semiconductor fin, the bilayer bottom spacer comprising a first layer and an oxygen-donating second layer positioned on horizontal surfaces of the first layer;
    a first dielectric film on the sidewalls of the first semiconductor fin, the first dielectric film terminating on the first layer; and
    a second dielectric film on the sidewalls of the second semiconductor fin, the second dielectric film extending onto a surface of the oxygen-donating second layer.

2. The semiconductor device of claim 1, wherein the first layer comprises SiBCN or SiN and the oxygen-donating second layer comprises $SiO_2$.

3. The semiconductor device of claim 2 further comprising a first top source or drain (S/D) region on a top surface of the first semiconductor fin and a second top S/D region on a top surface of the second semiconductor fin.

4. The semiconductor device of claim 3, wherein the first top S/D region comprises silicon doped with phosphorus and the second top S/D region comprises silicon germanium doped with boron.

5. The semiconductor device of claim 1 further comprising a first gate over channel regions of the first semiconductor fin and a second gate over channel regions of the second semiconductor fin.

6. The semiconductor device of claim 5, wherein the first gate comprises an n-type work function metal and the first dielectric film positioned between the n-type work function metal and the sidewalls of the first semiconductor fin; and wherein the second gate comprises a p-type work function metal and the second dielectric film positioned between the p-type work function metal and the sidewalls of the second semiconductor fin.

* * * * *